United States Patent
Ma et al.

(10) Patent No.: US 11,569,322 B2
(45) Date of Patent: Jan. 31, 2023

(54) DISPLAY DEVICE HAVING A BLOCKING LAYER

(71) Applicant: Samsung Display Co., Ltd., Yongin-Si (KR)

(72) Inventors: Jin Seock Ma, Hwaseong-si (KR); Gyung Min Baek, Yongin-si (KR); Hyun Eok Shin, Gwacheon-si (KR); Ju Hyun Lee, Seongnam-si (KR); Moo Soon Ko, Seoul (KR); Jin Goo Jung, Seongnam-si (KR); Kyung Hyun Choi, Seoul (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 17/210,421

(22) Filed: Mar. 23, 2021

(65) Prior Publication Data

US 2022/0037419 A1    Feb. 3, 2022

(30) Foreign Application Priority Data

Jul. 31, 2020   (KR) .......................... 10-2020-0096067

(51) Int. Cl.
    *H01L 27/32*      (2006.01)
(52) U.S. Cl.
    CPC .......... *H01L 27/326* (2013.01); *H01L 27/323* (2013.01); *H01L 27/3234* (2013.01); *H01L 27/3272* (2013.01)
(58) Field of Classification Search
    None
    See application file for complete search history.

(56) References Cited

U.S. PATENT DOCUMENTS

| | | | |
|---|---|---|---|
| 2014/0084293 A1 | 3/2014 | Ahn et al. | |
| 2019/0288043 A1* | 9/2019 | Shin | ................... H01L 51/5284 |
| 2020/0168689 A1* | 5/2020 | Park | ................... H01L 27/3276 |
| 2020/0326588 A1* | 10/2020 | Nian | ................ G02F 1/133528 |
| 2021/0336232 A1 | 10/2021 | Baek et al. | |

FOREIGN PATENT DOCUMENTS

| | | |
|---|---|---|
| KR | 10-0364600 B1 | 12/2002 |
| KR | 10-2003-0094094 A | 12/2003 |
| KR | 10-2011-0048166 A | 5/2011 |
| KR | 10-1345507 B1 | 12/2013 |
| KR | 10-2017-0077360 A | 7/2017 |
| KR | 10-2019-0084397 A | 7/2019 |
| KR | 10-2019-0092661 A | 8/2019 |
| KR | 10-2020-0023573 A | 3/2020 |
| KR | 10-2021-0132777 A | 11/2021 |

* cited by examiner

*Primary Examiner* — Suberr L Chi
(74) *Attorney, Agent, or Firm* — Innovation Counsel LLP

(57) ABSTRACT

A display device includes: a substrate including a display area and a transmission area; a blocking layer disposed in the display area of the substrate and including a first blocking layer and a second blocking layer that is disposed on the first blocking layer; an insulating layer disposed on the blocking layer; a transistor disposed on the insulating layer; and a light emitting element connected to the transistor, wherein a first reflectivity of the first blocking layer is smaller than a second reflectivity of the second blocking layer, and a first absorption coefficient of the first blocking layer is smaller than a second absorption coefficient of the second blocking layer.

22 Claims, 36 Drawing Sheets

FIG. 15
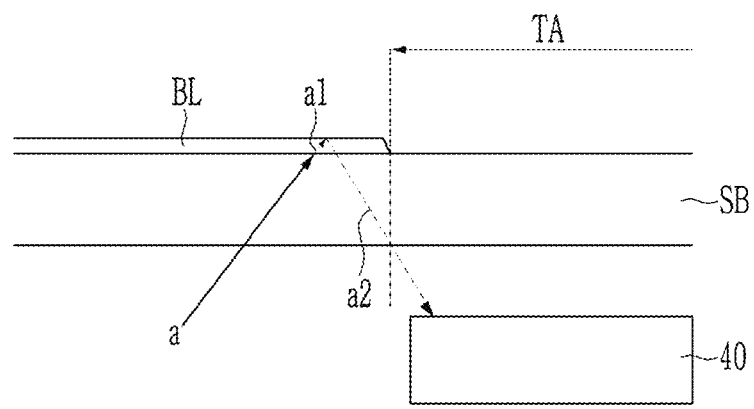
(a)
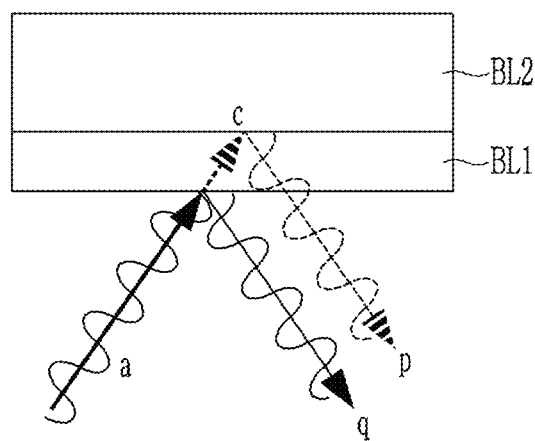
(b)

MoTiOx (Anneal: 400°C, 1Hr, N₂)
: Amorphous

MoTaOx (Anneal: 400°C, 1Hr, N₂)
: Crystallized

DISPLAY DEVICE HAVING A BLOCKING LAYER

CROSS-REFERENCE TO RELATED APPLICATION

This application claims priority to and the benefit of Korean Patent Application No. 10-2020-0096067 filed in the Korean Intellectual Property Office on Jul. 31, 2020, the disclosure of which is incorporated herein by reference in its entirety.

BACKGROUND

(a) Field

The present disclosure relates to a display device.

(b) Description of the Related Art

A display device may include an optical device such as a sensor or a camera. The optical device may be disposed in a bezel region (a region surrounding a display screen) of the display device to avoid interference with an image displayed on the display screen.

By reducing the bezel of the display device, a screen-to-body ratio of the display device that is defined by a ratio of an area occupied by the display screen with respect to the entire front surface area of the display device may be increased. The screen-to-body ratio of a display device may be considered as an important factor reflecting the technological advancement of the manufacturer of the display device and also plays an important role in the consumer's perception of a product and product selection.

The reduction of the bezel of the display device makes it difficult to dispose the optical device in the bezel region, and accordingly, a technology for disposing the optical device in the display screen has been developed and adopted. However, the optical device disposed in the display screen may affect the visibility of the optical device due to the light inflowing around the optical device.

The above information disclosed in this Background section is only for enhancement of understanding of the background of the present disclosure, and it may contain information that does not form the prior art that is already known to a person of ordinary skill in the art.

SUMMARY

According to an embodiment of the present disclosure, an optical device is disposed in a display screen of a display device, and a blocking layer of the display device may prevent an influence of light that may inflow around the optical device.

It is apparent that an object of the present disclosure is not limited to the above-described object, but may be variously extended without departing from the spirit and scope of the present disclosure.

A display device according to an embodiment includes: a substrate including a display area and a transmission area; a blocking layer disposed in the display area of the substrate and including a first blocking layer and a second blocking layer that is disposed on the first blocking layer; an insulating layer disposed on the blocking layer; a transistor disposed on the insulating layer; and a light emitting element connected to the transistor, wherein a first reflectivity of the first blocking layer is smaller than a second reflectivity of the second blocking layer, and an first absorption coefficient of the first blocking layer may be smaller than a second absorption coefficient of the second blocking layer.

The first blocking layer may include a metal oxide, an organic material, or amorphous silicon, and the second blocking layer may include a metal.

The first blocking layer may include a molybdenum oxide, and the second blocking layer may include molybdenum.

The first blocking layer may include tantalum in addition to the molybdenum oxide, and the first blocking layer may include 8 wt % or more of tantalum. The first blocking layer may include titanium in addition to the molybdenum oxide, and the first blocking layer may include about 50 wt % of titanium.

The display device may further include a first insulating layer disposed between the substrate and the first blocking layer, and the first insulating layer may include silicon.

The first insulating layer may include at least one of a silicon oxynitride, amorphous silicon, a silicon nitride, and a silicon oxide.

The display device may further include a second insulating layer disposed between the second blocking layer and the transistor, and the second insulating layer may include at least one of a silicon nitride, a silicon oxide, and a silicon oxynitride.

The second insulating layer may include a first layer and a second layer that is disposed on the first layer, and the first layer may include a silicon nitride, and the second layer includes a silicon oxide.

A display device according to another embodiment includes: a first display area including a first pixel area; a second display area including a second pixel area and a transmission area that are disposed adjacent to each other, wherein no pixel is disposed in the transmission area; an optical device overlapping the second display area; and a blocking layer disposed in the second pixel area and including a first blocking layer and a second blocking layer that is disposed on the first blocking layer, wherein a first reflectivity of the first blocking layer may be smaller than a second reflectivity of the second blocking layer, and a first absorption coefficient of the first blocking layer may be smaller than a second absorption coefficient of the second blocking layer.

The blocking layer may have an opening that overlaps the transmission area, and the opening may have a cross-shaped planar shape.

An edge of the opening may have recessed portions and convex portions.

The blocking layer may have an opening that overlaps the transmission area, and the opening may have a circular planar shape.

A display device according to another embodiment includes: a substrate including a display area and a transmission area; a blocking layer disposed in the display area of the substrate and including a first blocking layer and a second blocking layer that is disposed on the first blocking layer; an insulating layer disposed on the blocking layer; a transistor disposed on the insulating layer; and a light emitting element connected to the transistor, wherein the first blocking layer may include a metal oxide and the second blocking layer may include a metal.

A display device according to another embodiment includes: a substrate including a display area and a transmission area; a blocking layer disposed in the display area of the substrate and including a first blocking layer and a second blocking layer that is disposed on the first blocking layer; an insulating layer disposed on the blocking layer; a transistor disposed on the insulating layer; and a light emitting element connected to the transistor, wherein the first blocking layer may include an organic material, and the second blocking layer may include a metal.

A display device according to another embodiment includes: a substrate including a display area and a transmission area; a blocking layer disposed in the display area of the substrate and including a first blocking layer and a second blocking layer that is disposed on the first blocking layer; an insulating layer disposed on the blocking layer; a transistor disposed on the insulating layer; and a light emitting element connected to the transistor, wherein the first blocking layer may include amorphous silicon, and the second blocking layer may include a metal.

According to an embodiment, the display area of the display device may be widened by disposing the optical device in the display area, and an influence of light that may inflow around the optical device may be prevented.

The present disclosure is not limited to the embodiments disclosed herein, and it is understood that it may be variously extended without deviating from the spirit and scope of the present disclosure.

BRIEF DESCRIPTION OF THE DRAWINGS

FIG. 15 is a schematic view to explain a path of light of a display device according to an embodiment.

DETAILED DESCRIPTION OF THE EMBODIMENTS

Figure 1:
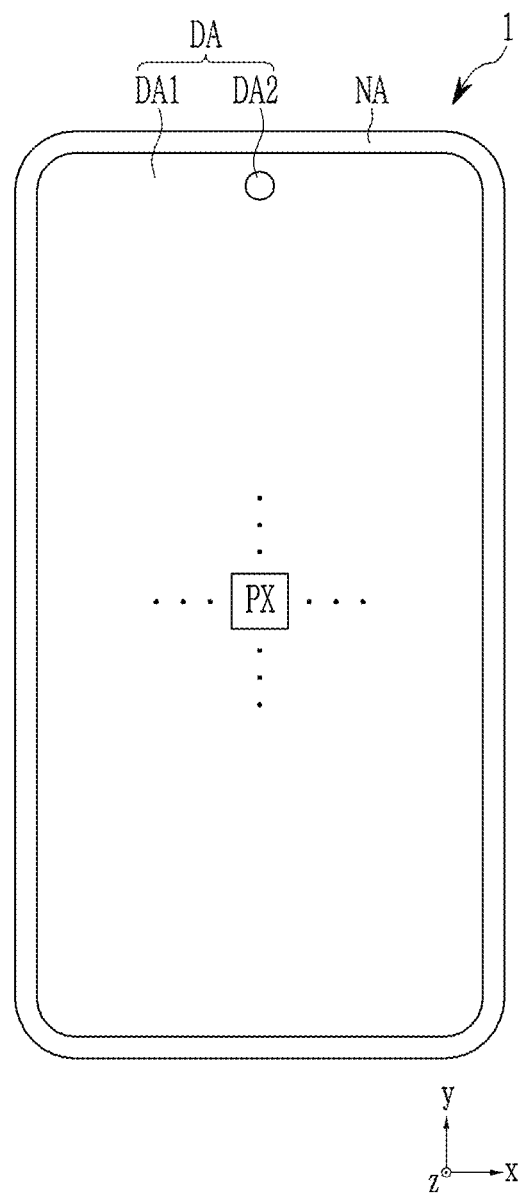
FIG. 1 is a schematic top plan view of a display device according to an embodiment.

The present disclosure will be described more fully hereinafter with reference to the accompanying drawings, in which embodiments of the present disclosure are shown. As those skilled in the art would realize, the described embodiments may be modified in various different ways, without departing from the spirit or scope of the present disclosure.

The drawings and description are to be regarded as illustrative in nature and not restrictive, and like reference numerals designate like elements throughout the specification.

In the drawings, size and thickness of elements are arbitrarily illustrated for convenience of description, and the present disclosure is not necessarily limited to the illustration in the drawings. In the drawings, the thickness of layers, films, panels, regions, etc., may be exaggerated for clarity and for convenience of description.

It will be understood that when an element such as a layer, film, region, or substrate is referred to as being "on" another element, it can be directly on the other element or one or more intervening elements may also be present therebetween. In contrast, when an element is referred to as being "directly on" another element, there may be no intervening elements present therebetween. Further, in the specification, the word "on" or "above" may mean being positioned on or below an object portion, and does not necessarily mean positioned on an upper side of the object portion based on a gravitational direction.

In addition, unless explicitly described to the contrary, the word "comprise" and variations such as "comprises" or "comprising" will be understood to imply an inclusion of stated elements but not an exclusion of any other elements.

Further, throughout the specification, the phrase "in a plan view" means viewing a target portion from the top, and the phrase "in a cross-sectional view" means viewing a cross-section formed by vertically cutting a target portion from the side.

In addition, in the specification, the expression "connected to" does not only mean that two or more constituent elements are directly connected to each other, but also that two or more constituent elements are electrically connected to each other through another element as well as being indirectly connected and being physically connected to each other, or they may be referred to by different names according to their positions and/or functions, but may be integrally formed.

In the drawings, a symbol x used to indicate a direction refers to a first direction, y refers to a second direction perpendicular to the first direction, and z refers to a third direction that is perpendicular to both the first direction and the second direction.

An emissive display device including light emitting elements is described as an example of a display device according to one or more embodiments with reference to the accompanying drawings.

Figure 2:
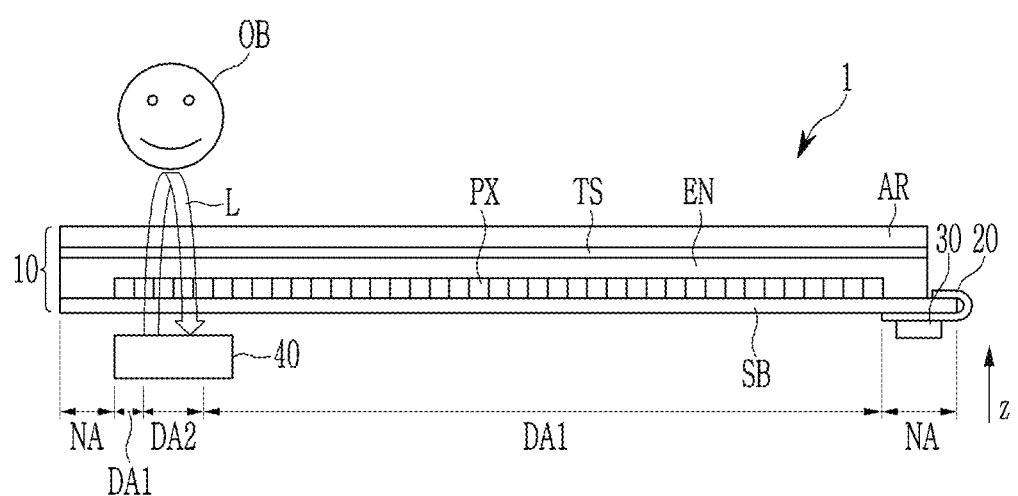
FIG. 2 is a schematic cross-sectional view of a display device according to an embodiment.

FIG. 1 is a schematic top plan view of a display device according to an embodiment, and FIG. 2 is a schematic cross-sectional view of a display device according to an embodiment.

Referring to FIG. 1 and FIG. 2, a display device 1 may include a display panel 10, a flexible printed circuit film 20 that is connected to the display panel 10, a driver including an integrated circuit chip 30, and an optical device 40.

The display panel 10 may include a display area DA on which an image is displayed, and a non-display area NA disposed to surround the display area DA and not displaying an image. The display area DA may correspond to a display screen of the display panel 10. The display panel 10 displays the image and detects a touch input.

A plurality of pixels PX are disposed in the display area DA. Here, a pixel PX is a minimum unit for displaying the image, and each pixel PX may display a specific color, for example one color among red, green, and blue colors with various luminances according to an input image signal.

In the non-display area NA, circuits and/or signal lines for generating and/or transmitting various signals applied to the display area DA are disposed. The signal lines such as gate lines, data lines, driving voltage lines, etc. may be connected to each pixel PX, and the pixel PX may receive gate signals, data voltages, and driving voltages from these signal lines.

The display area DA includes a first display area DA1 and a second display area DA2. The second display area DA2 may have higher transmittance than the first display area DA1, and it can perform other functions besides its own function of displaying the image. Here, the transmittance refers to transmittance of light that passes through the display panel 10 in the third direction z. The light may be visible light and/or light with a wavelength outside of the wavelength spectrum of the visible light (e.g., infrared light). The second display area DA2 may have a smaller density of the pixels PX than the first display area DA1. Here, the density of the pixels PX may refer to the number of the pixels PX per unit area.

In the display area DA, the second display area DA2 may be variously disposed. In the illustrated embodiment, the second display area DA2 is disposed within the first display area DA1 and is surrounded by the first display area DA1.

The second display area DA2 may be disposed in contact with the non-display area NA. The second display area DA2 may be disposed on the left, right, and/or center of an upper portion of the display area DA. The second display area DA2 may be disposed to be divided into two or more regions. The second display area DA2 may be disposed along the first direction x across the top of the display area DA. The second display area DA2 may be disposed along the second direction y across the left and/or right ends of the display area DA. The second display area DA2 may have various shapes such as polygons such as a quadrangle and a triangle, a circle, and an ellipse.

The driver that generates and/or processes the various signals for driving the display panel 10 may be disposed in the non-display area NA of the display panel 10. The driver may include a data driver that applies a data voltage to the data lines, a gate driver that applies a gate signal to the gate lines, and a signal controller (also referred to as a timing controller) that controls the data driver and the gate driver.

The driver may be integrated with the display panel 10 and may be disposed on both left and right sides or one side of the display area DA. The integrated circuit chip 30 (also referred to as a driving IC chip) may include the data driver and the signal controller, and the integrated circuit chip 30 may be mounted on the flexible printed circuit film 20 to be electrically connected to the display panel 10. The integrated circuit chip 30 may be mounted on the non-display area NA of the display panel 10 or mounted partially on the display area DA and partially on the non-display area NA of the display panel 10.

A touch sensing area TSA capable of detecting a touch input may approximately match the display area DA. A plurality of touch electrodes TE are arranged in the touch sensing area TSA. In one embodiment, one touch electrode TE may be disposed throughout the plurality of pixels PX. The touch electrodes TE may detect a user's contact and/or non-contact touch input. Each touch electrode TE may sense a touch input by a self-capacitor sensing method, or adjacent touch electrodes TE may sense a touch input by a mutual capacitor sensing method. The display panel 10 may be referred to as a touch screen panel. The display device 1 may include a touch driver that generates signals for driving the touch electrodes TE and processes the signals received from the touch electrodes TE. The touch driver may be provided in or as the integrated circuit chip 30.

The display panel 10 may include a substrate SB, and the plurality of pixels PX may be formed on the substrate SB. The substrate SB may be continuously disposed on the first display area DA1 and the second display area DA2.

The display panel 10 may include an encapsulation layer EN that may entirely cover the pixels PX. The encapsulation layer EN may encapsulate the first display area DA1 and the second display area DA2 to prevent moisture or oxygen from penetrating into the display panel 10.

A touch sensor layer TS in which the touch electrodes TE are arranged may be disposed on the encapsulation layer EN. The touch electrode TE may include a metal mesh. The touch electrode TE may be formed of a transparent conductive material such as an indium tin oxide (ITO) or an indium zinc oxide (IZO). The touch electrode TE may be formed as a single layer or multiple layers.

An anti-reflection layer AR for reducing a reflection of external light may be disposed on the touch sensor layer TS. The anti-reflection layer AR may include a polarization layer and/or a phase retardation layer. The anti-reflection layer AR may include a light blocking member and a color filter.

The optical device 40 may be disposed to overlap the display panel 10 on the back of the display panel 10. The optical device 40 may include a camera, a sensor, a flash, or etc. In a case where the optical device 40 includes a sensor, the optical device 40 may include a proximity sensor or an illuminance sensor. Light of the wavelength used by the optical device 40 may pass through the second display area DA2 that may have higher transmittance than the first display area DA1. In addition to the optical device 40, various electronic devices may be disposed on the rear of the display panel 10.

The optical device 40 may emit light L of a predetermined wavelength range toward an object OB disposed in front of the display panel 10 and/or receive light L reflected from the object OB. The light L of the predetermined wavelength range may be processed by the optical device 40, and may include visible light and/or infrared light. The light of the predetermined wavelength may mainly pass through the transmission area corresponding to the second display area DA2. In a case where the optical device 40 uses the infrared light, the predetermined wavelength of the light may be in a wavelength region of about 900 nm to 1000 nm. The optical device 40 may receive the light L of the predetermined wavelength that may be irradiated on the front surface of the display panel 10. The optical device 40 may be disposed to correspond to the entire second display area DA2 or may be disposed to correspond to only a portion of the second display area DA2. A plurality of optical devices 40 may be disposed in the second display area DA2.

Figure 3:
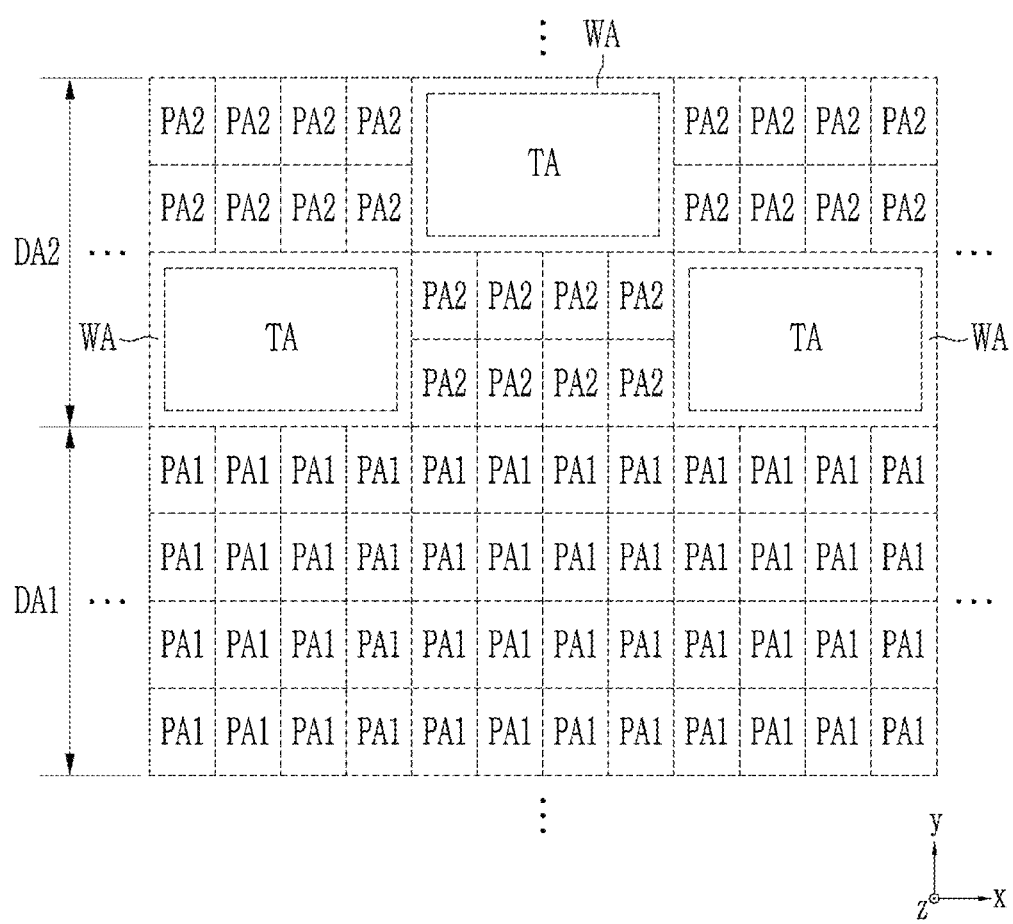
FIG. 3 is a schematic layout view of a portion of a first display area and a second display area of a display device according to an embodiment.

FIG. 3 is a schematic layout view of a portion of the first display area DA1 and the second display area DA2 of the display device 1 according to an embodiment.

Referring to FIG. 3, the first display area DA1 includes a plurality of first pixel areas PA1, and the second display area DA2 includes a plurality of second pixel areas PA2 and a plurality of transmission areas TA, and a plurality of wiring areas WA disposed between the plurality of second pixel areas PA2 and the plurality of transmission areas TA. Each of the plurality of wiring areas WA may be positioned to surround the plurality of transmission areas TA.

The size of one first pixel area PA1 and the size of one second pixel area PA2 may be the same or different from each other.

In the first display area DA1, the first pixel areas PA1 may be arranged in a matrix in the first direction x and the second direction y. In the second display area DA2, the second pixel areas PA2 and the transmission areas TA may be arranged in a matrix. The second pixel areas PA2 and the transmission areas TA may be arranged in a checkerboard pattern, and the second pixel areas PA2 and the transmission areas TA may be evenly mixed. That is, the transmission areas TA may be arranged to be adjacent to one second pixel area PA2 in the first direction x and in the second direction y, and the second pixel areas PA2 may be arranged to be adjacent to one transmission area TA in the first direction x and the second direction y. At least one second pixel area PA2 and at least one transmission area TA may be alternately arranged in the first direction x and/or the second direction y.

According to the embodiment shown in FIG. 3, eight second pixel areas PA2 may be disposed in the area corresponding to one transmission area TA, and an area ratio of the transmission area TA for the second pixel area PA2 may be 1:8 about in the second display area DA2. Also, a ratio of a sum of the area of the second pixel areas PA2 and a sum of the area of the transmission areas TA may be about 1:1 in the second display area DA2. However, it is understood that the number of second pixel areas PA2 disposed in the area corresponding to one transmission area TA may be variously changed in other embodiments without deviating from the scope of the present disclosure.

Each transmission area TA may have the same size or different sizes. The arrangement and size of the second pixel areas PA2 and the transmission areas TA may be varied without deviating from the scope of the present disclosure.

Each pixel area PA1 and PA2 may include at least one pixel PX. The pixel PX may include a pixel circuit and a light emitting unit. The pixel circuit refers to a circuit for driving a light emitting element such as a light emitting diode (LED), and may include a transistor, a capacitor, etc. The light emitting unit corresponds to a region where light emitted from the light emitting element is emitted. Also, in the second display area DA2, the pixel circuit may be disposed in the non-display area NA, and the pixel circuit and the pixel PX disposed in the second pixel areas PA2 may be connected through connection wiring that may be made of a transparent material to increase efficiency of the optical device 40.

Figure 4:
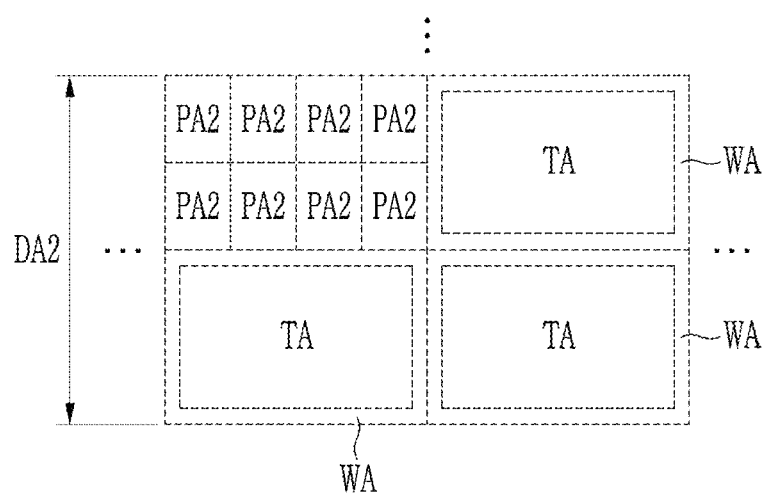
FIG. 4 is a schematic layout view of a portion of a second display area of a display device according to another embodiment.

FIG. 4 is a schematic layout view of a portion of the second display area DA2 of the display device 1 according to another embodiment.

According to the embodiment shown in FIG. 4, eight second pixel areas PA2 may be disposed in the area corresponding to one transmission area TA, and the area ratio of the transmission area TA for the second pixel area PA2 in the second display area DA2 may be about 1:8. Also, the ratio of the sum of the area of the second pixel areas PA2 and the sum of the area of the transmission areas TA may be about 1:3 in the second display area DA2. The plurality of transmission areas TA may be disposed along the first direction x and the second direction y to surround the periphery of eight second pixel areas PA2 in the second display area DA2.

Compared with the embodiment previously shown in FIG. 3, the area of the transmission areas TA is relatively larger compared with the second pixel areas PA2 in the second display area DA2. Accordingly, the efficiency of the optical device 40 disposed in the second display area DA2 may be increased.

Figure 5:
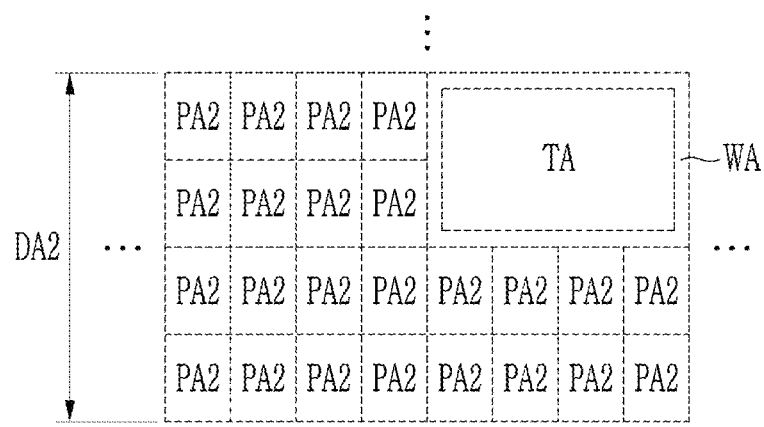
FIG. 5 is a schematic layout view of a portion of a second display area of a display device according to another embodiment.

FIG. 5 is a schematic layout view of a portion of the second display area DA2 of the display device 1 according to another embodiment.

According to the embodiment shown in FIG. 5, eight second pixel areas PA2 may be disposed in the area corresponding to one transmission area TA, and the area ratio of the transmission area TA for the second pixel area PA2 in the second display area DA2 may be about 1:8. Also, in the second display area DA2, the ratio of the sum of the area of the second pixel areas PA2 and the sum of the area of the transmission areas TA may be about 3:1 in the second display area DA2. Eight second pixel areas PA2 grouped together may be disposed along the first direction x and the second direction y to surround the periphery of one transmission area TA in the second display area DA2.

Compared with the embodiment shown in FIG. 3 above, the area of the second pixel areas PA2 is relatively larger than the area of the transmission areas TA. Accordingly, the efficiency of the plurality of pixels PX disposed in the second display area DA2 may be increased, and more accurate images may be displayed.

The arrangements of the second pixel areas PA2 and the transmission areas TA of the second display area DA2 of the display device 1 described with reference to FIG. 3 to FIG. 5 are only examples, and the area and arrangement of the pixel area and the transmission area may be changed in other embodiments.

The size of one second pixel area PA2 and the size of one transmission area TA may be substantially the same or may be different from each other. Each of the transmission areas TA may have substantially the same size or different sizes. The arrangement and size of the second pixel areas PA2 and the transmission areas TA may be varied. The ratio of the area of the transmission areas TA and the area of the second pixel areas PA2 in the second display area DA2 may be about 1:2n−1 (where n is a natural number), for example, but not limited to, 1:3, or about 1:7, and 1:15. The pixel density and transmittance of the second display area DA2 may vary depending on the ratio of the sum of the areas of the transmission area TA to the sum of the area of the second pixel areas PA2. The pixel density and transmittance may be in a trade-off relationship.

Figure 6:
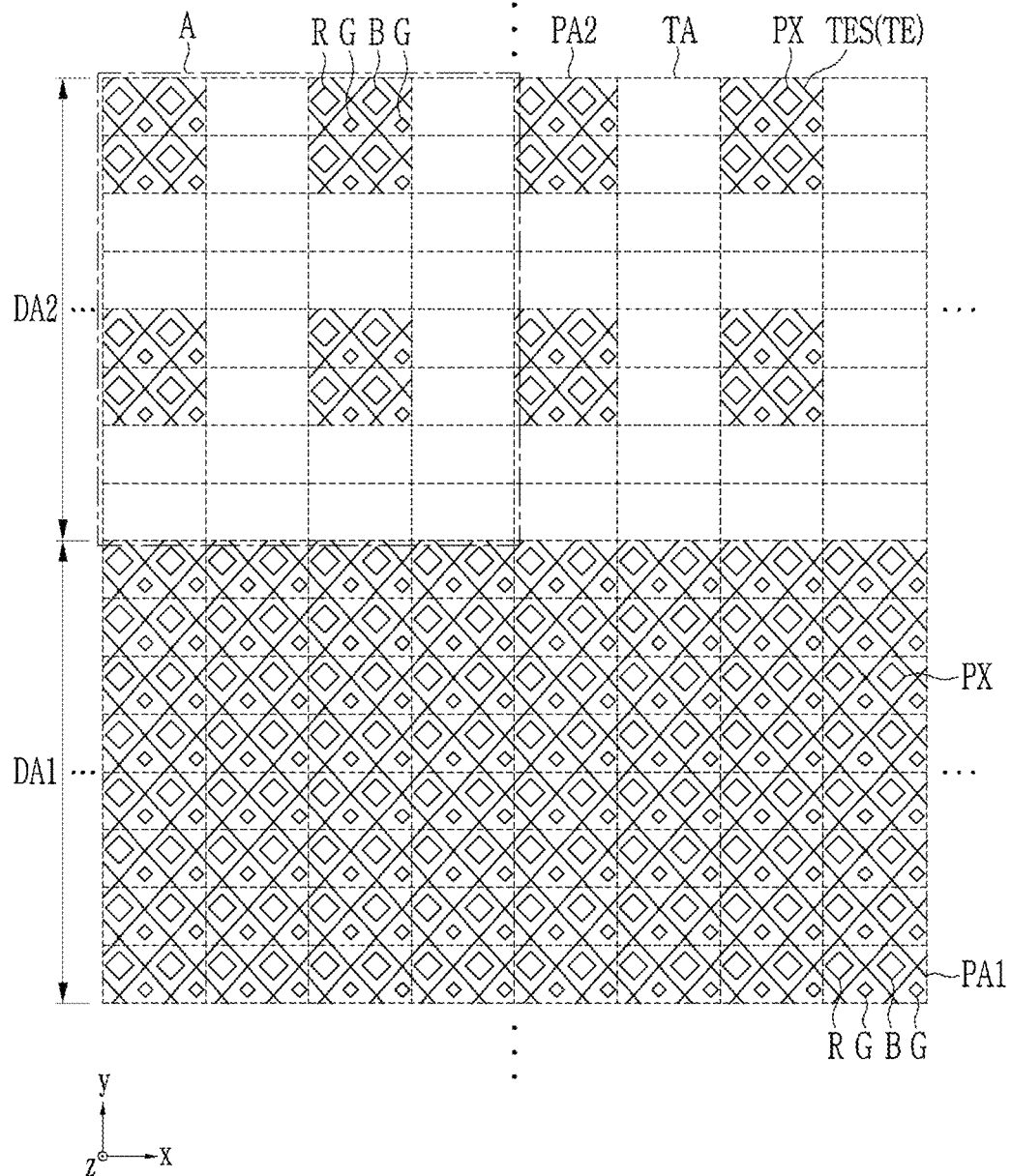
FIG. 6 is a schematic layout view of a first display area and a second display area of a display device according to an embodiment.
Figure 7:
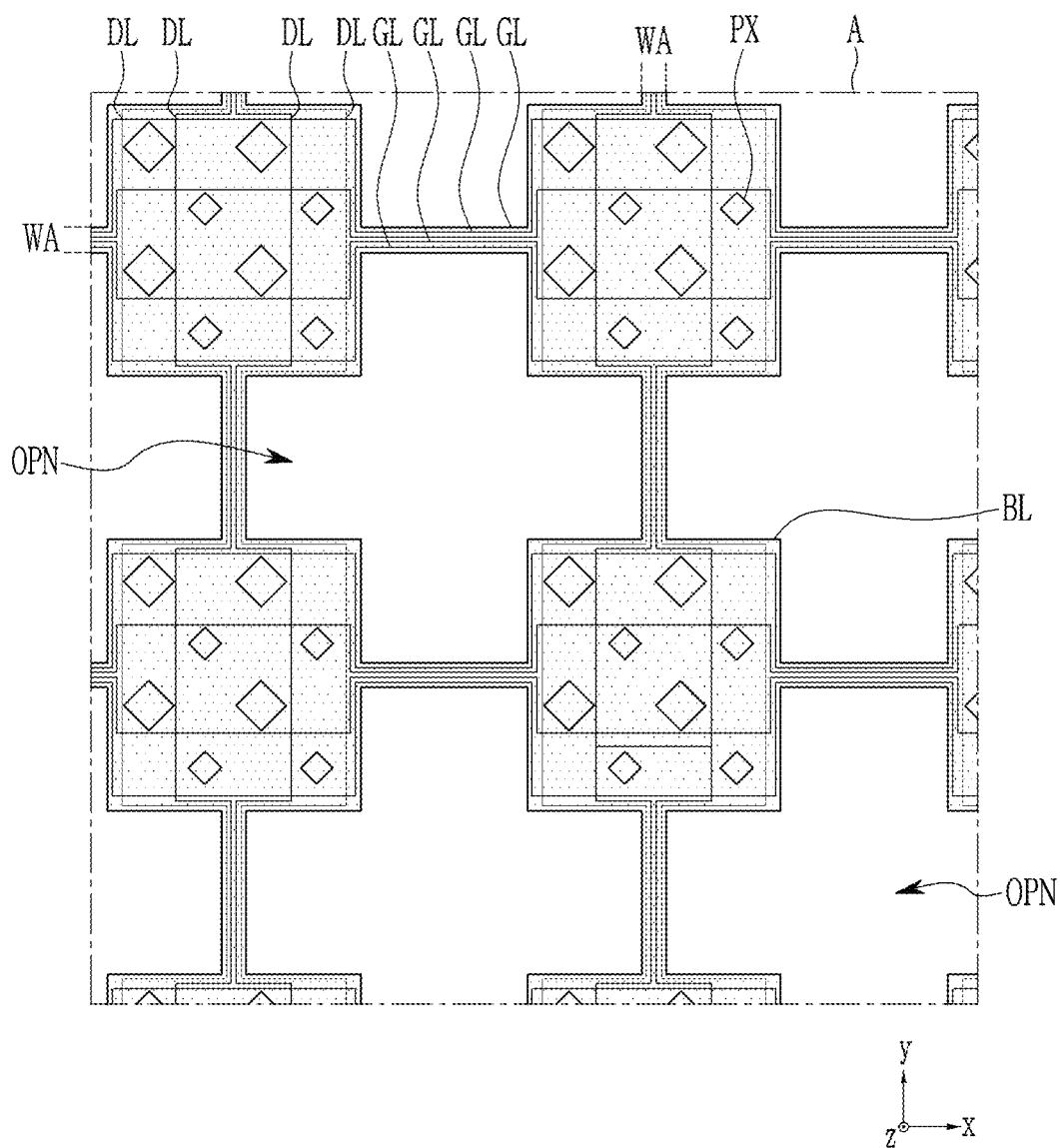
FIG. 7 is a schematic enlarged view of a region A in FIG. 6 according to an embodiment.

FIG. 6 is a schematic layout view of the first display area DA1 and the second display area DA2 of the display device 1 according to an embodiment, and FIG. 7 is a schematic enlarged view of a region A in FIG. 6 according to an embodiment.

The first pixel area PA1 and the second pixel area PA2 may include at least one pixel PX, respectively. The pixel PX shown in FIG. 6 may correspond to the light emitting unit. The light emitting unit may be a rhombus type, a rectangle or a circle. The pixel PX may emit light substantially in the third direction z. A touch electrode section TES may be disposed in the first pixel area PA1 and the second pixel area PA2. The touch electrode section TES may be formed of a metal mesh in which metal wires are entangled like a net, and the metal mesh may be disposed without covering the light emitting unit. A plurality of touch electrode sections TES may be connected to each other to form one touch electrode TE.

The transmission area TA may not include the pixel circuit and the light emitting unit. In the transmission area TA, the pixel circuit, the light emitting unit, and the touch electrode TE that may interfere with the transmission of light may not be positioned at all or may be scarcely positioned to provide a light transmittance that is higher than that of the first and second pixel areas PA1 and PA2.

The wiring areas WA may be disposed around the second pixel areas PA2, and a plurality of signal lines such as gate lines GL and data lines DL may be disposed in the first pixel area PA1 and the second pixel area PA2, and the wiring areas WA.

According to the embodiment shown in FIG. 6, each of the first pixel area PA1 and the second pixel area PA2 may include one red pixel R, two green pixels G, and one blue pixel B. Alternately, the pixel arrangement of the first pixel area PA1 and the second pixel area PA2 may be different from each other. A set of the red, green, and blue pixels R, G, and B included in each pixel area PA1 and PA2 is referred to as a unit pixel. In another embodiment, the unit pixel may include one red pixel R, one green pixel G, and one blue pixel B. The unit pixel may include at least one among the red pixel R, the green pixel G, and the blue pixel B, and may also include a white pixel.

The pixels R, G, and B included in the first display area DA1 and the second display area DA2 may form a pixel row in the first direction x.

In each pixel row in the first display area DA1 and the second display area DA2, the pixels R, G, and B may be arranged in the first direction x. For example, the pixels R, G, and B may be repeatedly arranged in the order of the red pixel R, the green pixel G, the blue pixel B, and the green pixel G in the first direction x. The arrangement of the pixels R, G, and B included in one pixel row may be variously changed. For example, the pixels R, G, and B are repeatedly arranged in the order of the blue pixel B, the green pixel G, the red pixel R, and the green pixel G, or in the order of the red pixel R, the blue pixel B, the green pixel G, and the blue pixel B in the first direction x.

The pixels R, G, and B of the first and second pixel areas PA1 and PA2 may also form a pixel column in the second direction y. In each pixel column, the pixels R, G, and B may be arranged in the second direction y. In each pixel column, pixels PX of the same color may be disposed, and pixels PX of two or more colors may be disposed alternately in the second direction y. The arrangement of the pixels R, G, and B included in one pixel column may be variously changed.

The pixels R, G, and B in the second pixel area PA2 may be a cross-section emission type pixel, for example, a top emission type pixel emitting light in the third direction z. The pixels R, G, and B of the second pixel area PA2 may be of a bottom emission type or a double-sided emission type in other embodiments.

Referring to FIG. 7, the second pixel area PA2 and the transmission area TA may be disposed to be adjacent to each other in the second display area DA2, and the second pixel area PA2 includes the red, green, and blue pixels R, G, and B. A gate line GL transmitting a gate signal to the pixels R, G, and B may extend in the first direction x, and a data line DL transmitting a data signal may extend in the second direction y. One data line DL may be disposed in each pixel column. Each data line DL may extend over the first display area DA1 and the second display area DA2. Gate-on voltages of different timings may be transmitted to each pixel row, and two or more gate lines GL may be disposed in each pixel row. Unlike the embodiment illustrated in FIG. 7, a plurality of data lines DL may be provided to each pixel column, or one data line DL may be provided to a respective one of the plurality of pixel columns.

The gate line GL and the data line DL may be disposed in the wiring area WA disposed at the boundary of the adjacent transmission areas TA to prevent deterioration of the transmittance of the transmission area TA.

A blocking layer BL may be disposed in the second pixel area PA2, and the blocking layer BL may have an opening OPN disposed in the transmission area TA. The blocking layer BL may also be disposed in the wiring area WA that is disposed to surround the periphery of the transmission area TA to prevent the light passing through the transmission area TA from diffracting around the transmission area TA, thereby preventing deterioration of the performance of the optical device 40 by ambient light.

According to the embodiment of FIG. 7, the opening OPN of the blocking layer BL may have an approximate cross-shaped planar shape, and the sizes of the upper protruded portion, the lower protruded portion, the left protruded portion, and the right protruded portion of the cross-shaped opening OPN may be substantially the same.

The blocking layer BL may include a metal, and may prevent light from the outside inflowing to the second pixel area PA2 and light passing through the transmission area TA from diffracting around the transmission area TA.

The opening OPN of the blocking layer BL with the approximate cross shape may reduce diffraction of light that may occur around the opening OPN of the blocking layer BL.

The blocking layer BL may be disposed to overlap the wiring area WA in which the signal lines transmitting the signal to the second pixel area PA2 are disposed to prevent light from inflowing to the signal lines disposed in the wiring area WA and from being reflected from a surface of the signal lines and recognized on a side of the transmission area TA.

Figure 8:
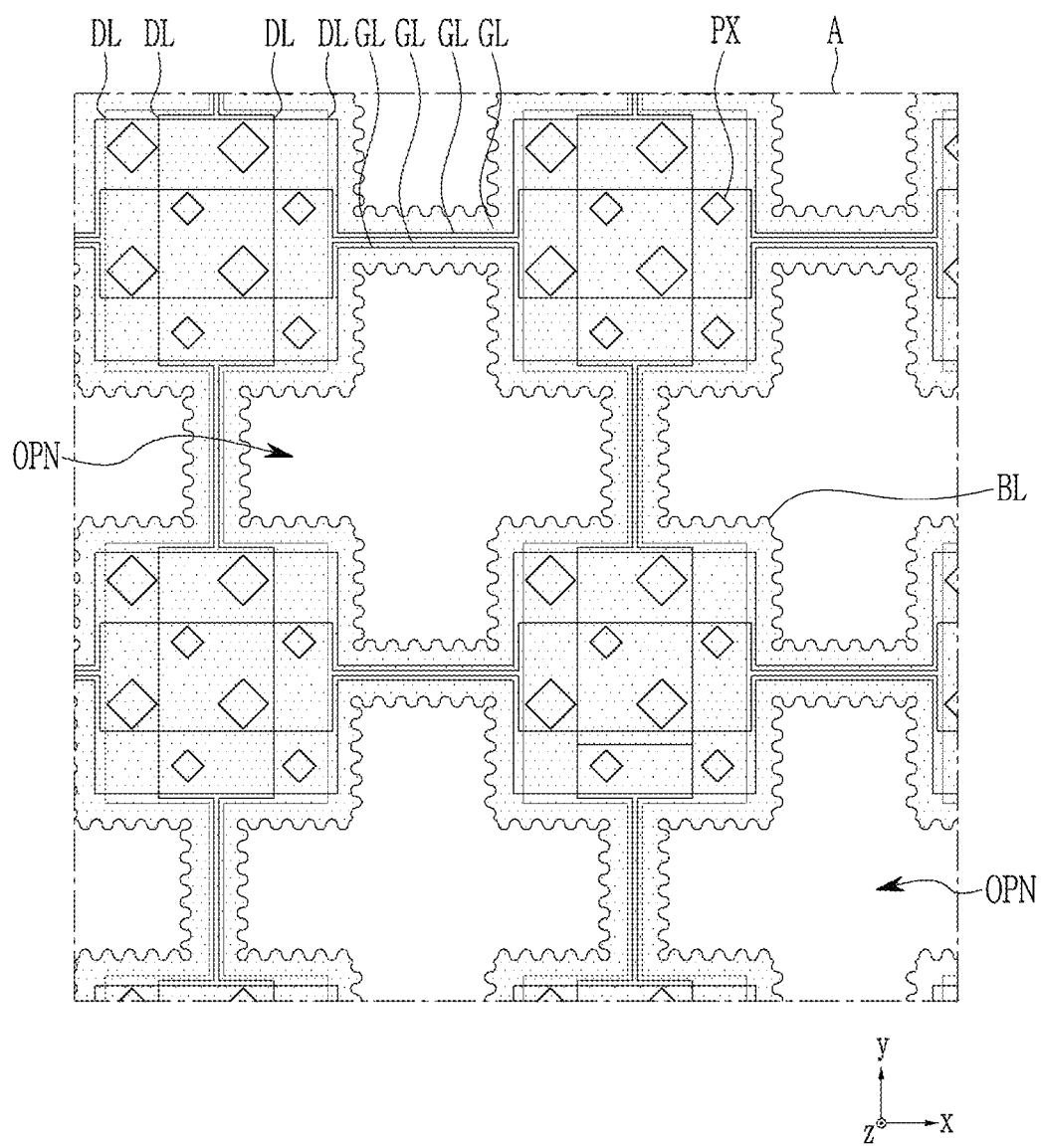
FIG. 8 is a schematic enlarged view of the region A in FIG. 6 according to another embodiment.

FIG. 8 is a schematic enlarged view of the region A according to another embodiment. According to the embodiment of FIG. 8, the opening OPN of the blocking layer BL has a planar shape of an approximate cross shape, and the size of the upper, lower, left, and right protruded portions of the opening OPN may be substantially the same. In addition, the edge of the opening OPN of the blocking layer BL may not be a straight line, but may have an embossed shape in which recessed portions and convex portions are repeated.

The opening OPN of the blocking layer BL formed of the approximate cross shape and having the edge formed of the embossed shape may reduce diffraction of light that may occur around the opening OPN of the blocking layer BL.

Figure 9:
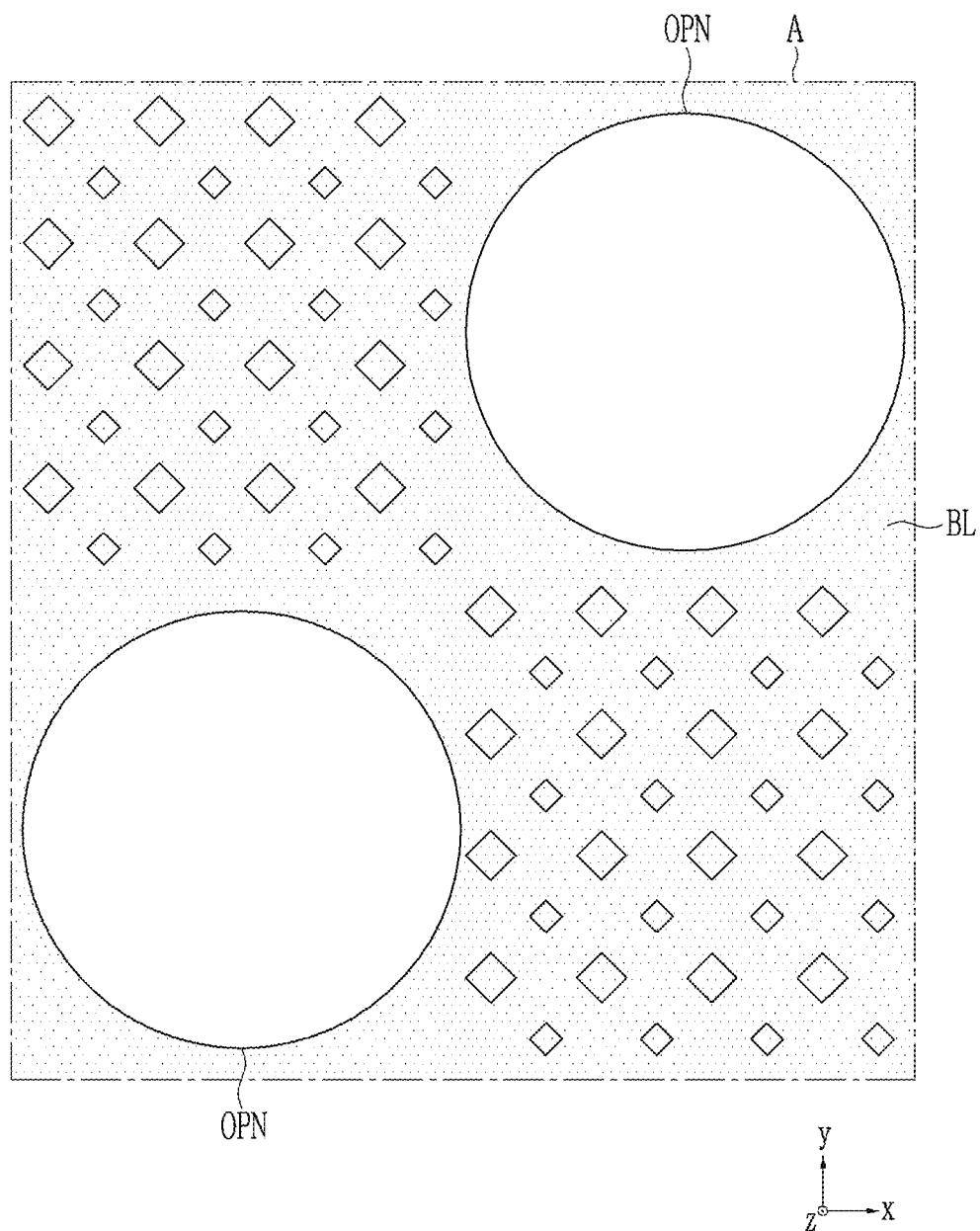
FIG. 9 is a schematic enlarged view of the region A in FIG. 6 according to yet another embodiment.

FIG. 9 is a schematic enlarged view of the region A in FIG. 6 according to yet another embodiment. According to the embodiment of FIG. 9, the opening OPN of the blocking layer BL has an approximate circular planar shape.

The opening OPN of the blocking layer BL formed of the approximate circular planar shape may reduce diffraction of light that may occur around the opening OPN of the blocking layer BL.

Figure 10:
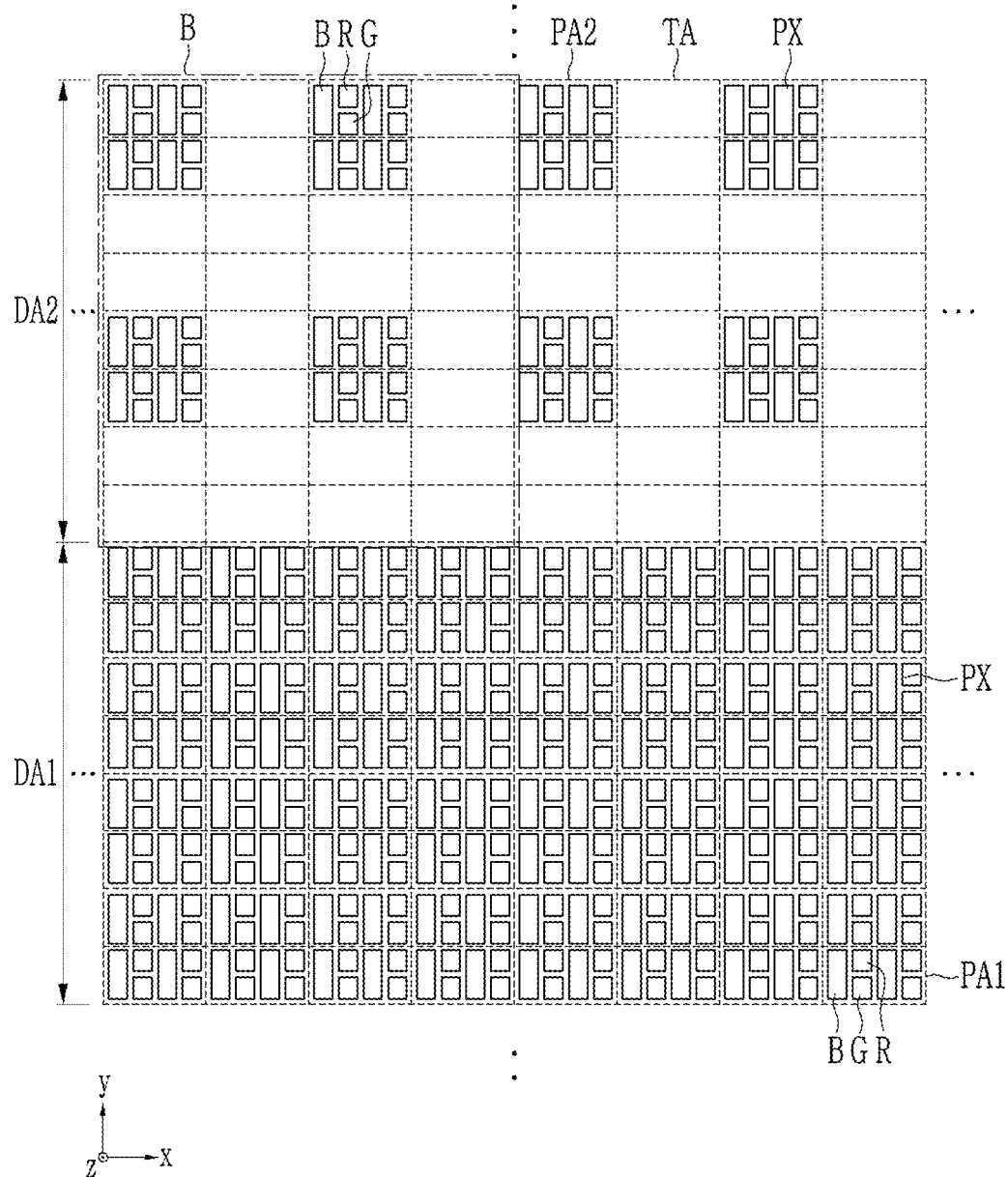
FIG. 10 is a schematic layout view of a first display area and a second display area of a display device according to another embodiment.
Figure 11:
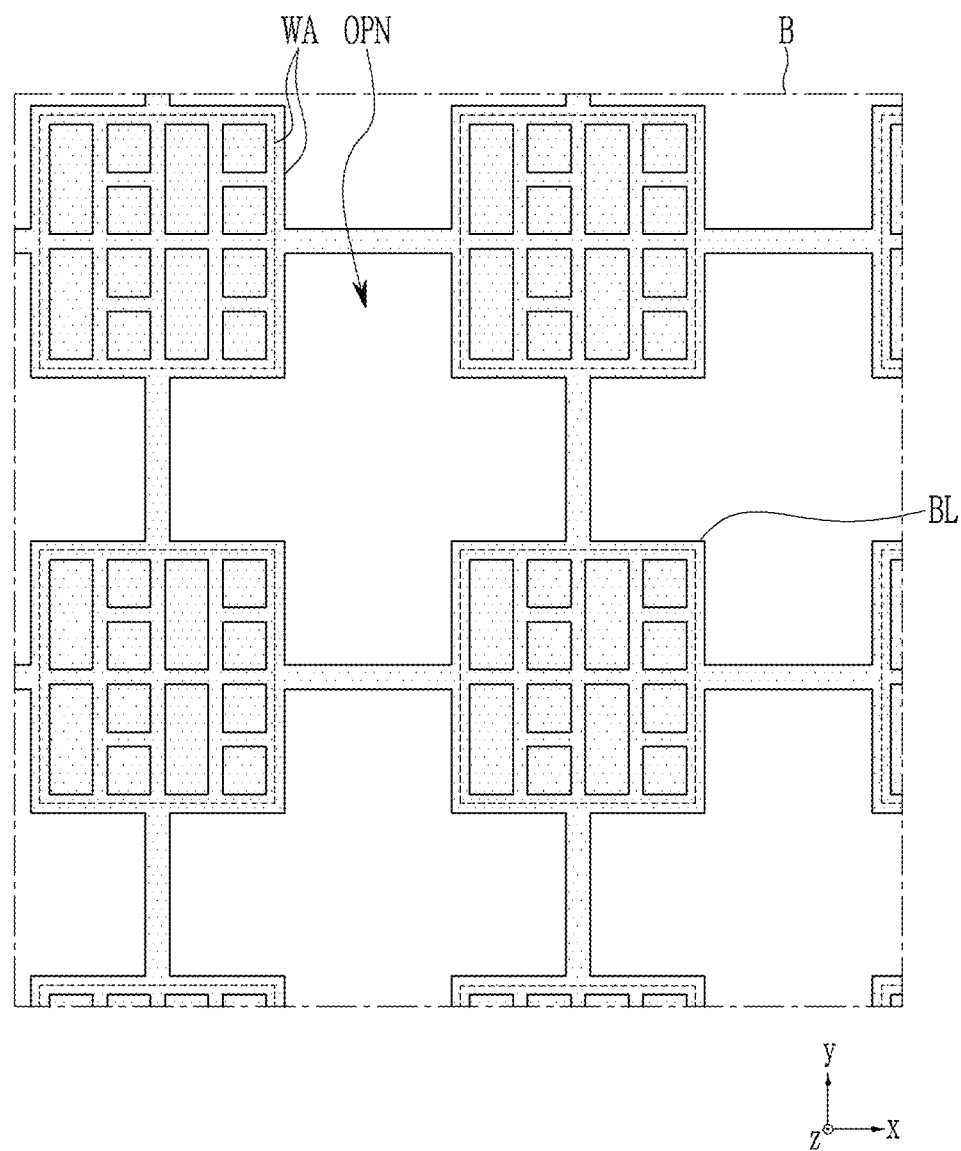
FIG. 11 is a schematic enlarged view of a region B in FIG. 10 according to an embodiment.

FIG. 10 is a schematic layout view of the first display area DA1 and the second display area DA2 of the display device 1 according to another embodiment, and FIG. 11 is a schematic enlarged view of a region B in FIG. 10 according to an embodiment.

Similar to the display device 1 illustrated above in FIG. 6 and FIG. 7, each of the first pixel area PA1 and the second pixel area PA2 may include at least one pixel PX.

Referring to FIG. 10 and FIG. 11, the first pixel area PA1 and the second pixel area PA2 may include one blue pixel B, one red pixel R, and one green pixel G, but they may have different unit pixel configurations without deviating from the scope of the present disclosure. The pixel PX may have a rectangular planar shape.

The plane size of the blue pixel B may be larger than the plane size of the red pixel R and the plane size of the green pixel G. For example, the plane size of the blue pixel B may be about twice the plane size of the red pixel R and the plane size of the green pixel G.

The pixels R, G, and B included in the first display area DA1 and the second display area DA2 may respectively form a pixel row in the first direction x.

In each pixel row in the first display area DA1 and the second display area DA2, the pixels R, G, and B may be arranged in a line about in the first direction x. In each pixel row, the red pixel R and the green pixel G that are adjacent to one blue pixel BL in the second direction y may be repeatedly arranged in the first direction x for the pixels R, G, and B. The arrangement of the pixels R, G, and B included in one pixel row may be variously changed.

The pixels R, G, and B of the first and second pixel areas PA1 and PA2 may also form a pixel column in the second direction y. In each pixel column, the pixels R, G, and B may be arranged in in the second direction y. In each pixel column, the pixels PX of the same color may be disposed, and the pixels PX of two or more colors may be disposed alternately in the second direction y. The arrangement of the pixels R, G, and B included in one pixel column may be variously changed.

The pixels R, G, and B in the second pixel area PA2 may be a cross-section emission type pixel, for example, a top emission type pixel emitting light in a third direction z. The pixels R, G, and B of the second pixel area PA2 may be of a bottom emission type or a double-sided emission type in other embodiments.

According to the embodiment of FIG. 11, the opening OPN of the blocking layer BL may have an approximate cross-shaped planar shape, and the sizes of the upper protruded portion, the lower protruded portion, the left protruded portion, and the right protruded portion of the opening OPN of the cross shape may be substantially the same.

The opening OPN of the blocking layer BL with the approximate cross shape may reduce the effect of the diffraction of light that may occur around the opening OPN of the blocking layer BL.

Figure 12:
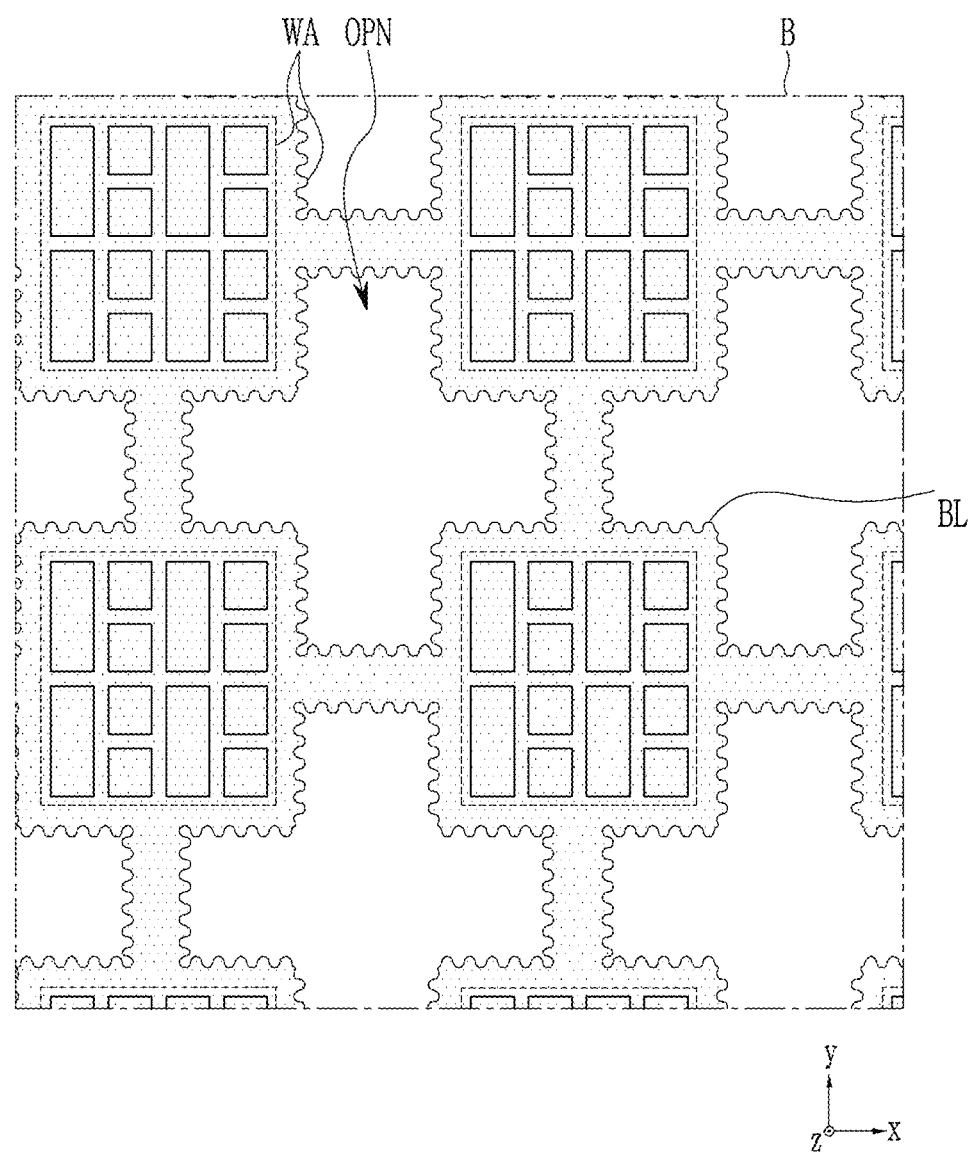
FIG. 12 is a schematic enlarged view of the region B in FIG. 10 according to another embodiment.

FIG. 12 is a schematic enlarged view the region B of FIG. 10 according to another embodiment. According to the embodiment of FIG. 12, the opening OPN of the blocking layer BL has a planar shape of an approximate cross shape, and the size of the upper, lower, left, and right protruded portions of the opening OPN may be substantially the same. In addition, the edge of the opening OPN of the blocking layer BL may not be a straight line, but may have the embossed shape in which the recessed portions and the convex portions are repeated.

The opening OPN of the blocking layer BL formed of the approximate cross shape and having the edge formed of the embossed shape may reduce the diffraction of light that may occur around the opening OPN of the blocking layer BL.

Figure 13:
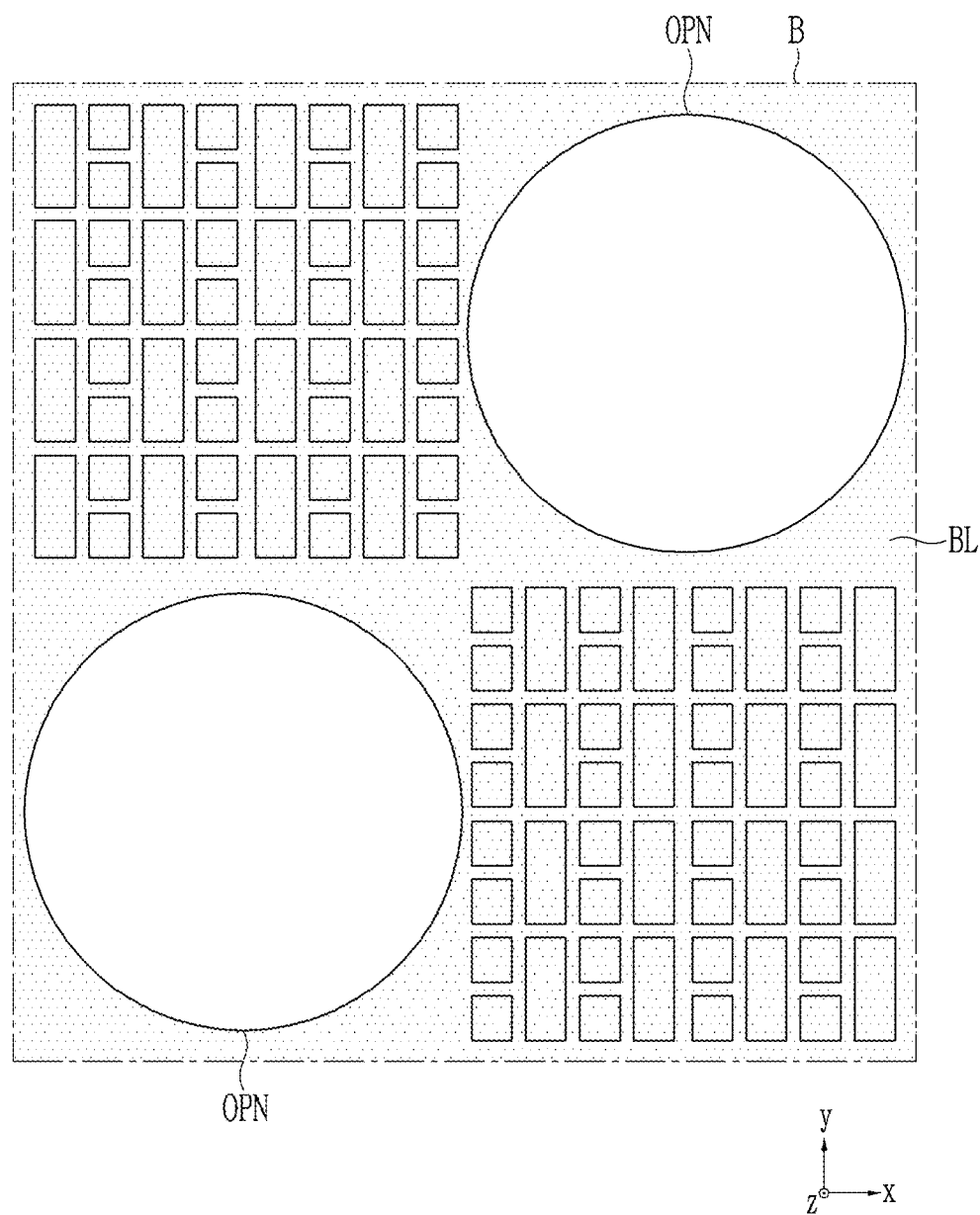
FIG. 13 is a schematic enlarged view of the region B in FIG. 10 according to yet another embodiment.

FIG. 13 is a schematic enlarged view of the region in FIG. 10 according to yet another embodiment. According to the embodiment of FIG. 13, the opening OPN of the blocking layer BL may have an approximate circular planar shape.

The opening OPN of the blocking layer BL formed of the approximate circular planar shape may reduce diffraction of light that may occur around the opening OPN of the blocking layer BL.

Figure 14:
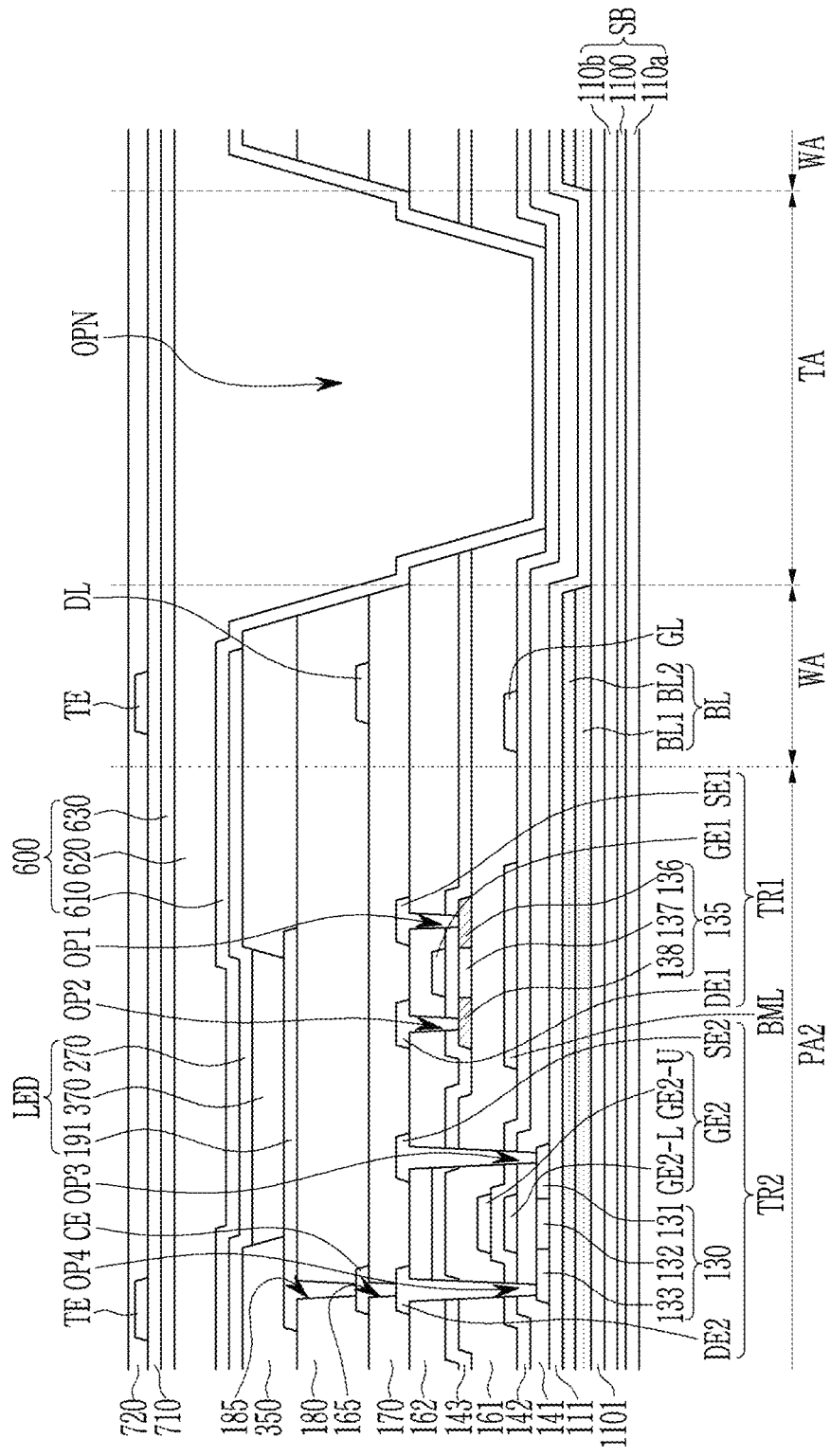
FIG. 14 is a cross-sectional view of a portion of a second display area of a display device according to an embodiment.

FIG. 14 is a cross-sectional view of a portion of the second display area DA2 of the display device 1 according to an embodiment. According to the embodiment shown in FIG. 14, the display device 1 includes a first transistor TR1, a second transistor TR2, and a light emitting diode LED, and further includes the second pixel area PA2 and the transmission area TA that may display the image, and the wiring area WA that is disposed around the second pixel area PA2. For facilitating comprehension and ease of description, the first transistor TR1, the second transistor TR2, and the light emitting diode LED that is connected to the second transistor TR2 are mainly described, however it is understood that the present disclosure not limited thereto, and additional transistors may be further included. The first transistor TR1 may be referred to as a switching transistor, and the second transistor TR2 may be referred to as a driving transistor.

The substrate SB may include a polymer such as polyimide or polyamide or an insulating material such as glass, and may be optically transparent. In the embodiment shown in FIG. 14, the substrate SB may include a first transparent layer 110*a* and a second transparent layer 110*b* overlapping each other, and a first barrier layer 1100 disposed between the first transparent layer 110a and the second transparent layer 110b.

The first transparent layer 110a and the second transparent layer 110b may include polymers such as polyimide and polyamide, for example, at least one among polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, cellulose triacetate, and cellulose acetate propionate.

The first barrier layer 1100 may prevent penetration of moisture, etc., and may include inorganic insulating materials such as a silicon oxide (SiOx), a silicon nitride (SiNx), and a silicon oxynitride (SiOxNy). The first barrier layer 1100 may include amorphous silicon (Si).

A second barrier layer 1101 may be disposed on the substrate SB. The second barrier layer 1101 may flatten a surface while preventing the penetration of unnecessary components such as impurities or moisture. The second barrier layer 1101 may include at least one of a silicon oxide, a silicon nitride, a silicon oxynitride, and amorphous silicon.

The blocking layer BL may be disposed on the second barrier layer 1101. The blocking layer BL may prevent light from inflowing from the lower part of the substrate 110 and being recognized. Particularly, the blocking layer BL is disposed in the second pixel area PA2 and the wiring area WA, excluding the transmission area TA, to prevent light leakage around the transmission area TA, thereby preventing performance deterioration of an electronic device that may be disposed under the transmission area TA due to external light.

The blocking layer BL may include a first blocking layer BL1 and a second blocking layer BL2 that is disposed on the first blocking layer BL1.

An absorption coefficient k of the second blocking layer BL2 may be greater than that of the first blocking layer BL1. Reflectivity n of the second blocking layer BL2 may be greater than that of the first blocking layer BL1. The absorption coefficients k and the reflectivities n of the first blocking layer BL1 and the second blocking layer BL2 may be measured based on a visible light region, for example, light in a wavelength range of about 380 nm to about 780 nm.

The first blocking layer BL1 of the blocking layer BL may include a material having low reflectivity of light. Therefore, light may be reflected from the blocking layer BL, thereby preventing recognition of the optical device 40 by the light that may be otherwise incident on the optical device 40.

The first blocking layer BL1 of the blocking layer BL may include a metal oxide, an organic material, or amorphous silicon. In a case where the first blocking layer BL1 includes an organic material, the same organic material may be used as a pixel definition layer (e.g., a pixel definition layer 350 shown in FIG. 14), and a material having a black color may be included.

A metal oxide that is included in the first blocking layer BL1 may be a molybdenum oxide. The first blocking layer BL1 may include a metal impurity in the molybdenum oxide. For example, the first blocking layer BL1 may include tantalum or titanium in the molybdenum oxide.

The first blocking layer BL1 may include a molybdenum oxide such as a molybdenum tantalum oxide (MoTaO$_x$) or a molybdenum titanium oxide (MoTiO$_x$).

The tantalum or titanium included in the molybdenum oxide may increase a heat resistance characteristic of the first blocking layer BL1, thereby maintaining an optical characteristic of the first blocking layer BL1 even after a high temperature process.

For example, the first blocking layer BL1 may include a molybdenum tantalum oxide (MoTaOx) having a tantalum content about 8 wt % or more. In this case, the optical characteristic of the first blocking layer BL1 may be maintained even after the high temperature process at about 450° C.

In another example, the first blocking layer BL1 may include a molybdenum titanium oxide (MoTiOx) having a titanium content about 50 wt %, for example, 45-55 wt %. In this case, the optical characteristic of the first blocking layer BL1 may be maintained even after the high temperature process at about 450° C.

The thickness of the first blocking layer BL1 may be 2000 Å or less, specifically, 350 Å or more and 1000 Å or less.

The second blocking layer BL2 of the blocking layer BL may include a metal. For example, the second blocking layer BL2 may include molybdenum (Mo), aluminum (Al), titanium (Ti), copper (Cu), or the like.

Because the blocking layer BL includes the first blocking layer BL1 having a relatively small absorption coefficient k and the second blocking layer BL2 having a relatively large absorption coefficient k, the light inflow from the lower part of the display device 1 may be prevented from being reflected from the blocking layer BL and inflowing to a side of the optical device 40 that may be disposed under the substrate SB.

A buffer layer 111 may be disposed on the second barrier layer 1101 and the blocking layer BL. The buffer layer 111 may have a single layer or a multi-layered structure. The buffer layer 111 may include a silicon nitride (SiN$_x$), a silicon oxide (SiO$_x$), or a silicon oxynitride (SiO$_x$N$_y$).

A second semiconductor layer 130 may be disposed on the buffer layer 111. The second semiconductor layer 130 may include a polycrystalline silicon material, for example, a polycrystalline semiconductor. The second semiconductor 130 layer may include a channel region 132, and a source region 131 and a drain region 133 that are positioned on respective sides of the channel region 132.

The source region 131 of the second semiconductor layer 130 may be connected to a second source electrode SE2, and the drain region 133 of the second semiconductor layer 130 may be connected to a second drain electrode DE2.

A first gate insulating layer 141 may be disposed on the second semiconductor layer 130. The first gate insulating layer 141 may have a single layer or a multi-layered structure including a silicon nitride, a silicon oxide, a silicon oxynitride, or the like.

A second gate lower electrode GE2-L may be disposed on the first gate insulating layer 141. The second gate lower electrode GE2-L may include molybdenum (Mo), aluminum (Al), copper (Cu), and/or titanium (Ti), and may have a single layer or a multi-layered structure including the same.

A second gate insulating layer 142 may be disposed on the second gate lower electrode GE2-L. The second gate insulating layer 142 may include a silicon nitride, a silicon oxide, a silicon oxynitride, etc. The second gate insulating layer 142 may have a single layer or a multi-layered structure including a silicon nitride, a silicon oxide, and/or a silicon oxynitride.

A second gate upper electrode GE2-U and the gate line GL may be disposed on the second gate insulating layer 142. The second gate lower electrode GE2-L and the second gate upper electrode GE2-U may overlap each other with the second gate insulating layer 142 interposed therebetween.

The second gate upper electrode GE2-U and the second gate lower electrode GE2-L may form a second gate electrode GE2. The second gate electrode GE2 may overlap the channel region 132 of the second semiconductor layer 130 in a direction perpendicular to the substrate SB, i.e., the third direction z. The second gate upper electrode GE2-U and the gate line GL may contain molybdenum (Mo), aluminum (Al), copper (Cu) silver (Ag), chromium (Cr), tantalum (Ta), titanium (Ti), etc., and may be a single layer or a multi-layered structure including the same.

A metal blocking layer BML including the second gate upper electrode GE2-U and the gate line GL may be disposed on the second gate insulating layer 142. The metal blocking layer BML may overlap the first transistor TR1.

The second semiconductor layer 130, the second gate electrode GE2, the second source electrode SE2, and the second drain electrode DE2 may form the second transistor TR2. The second transistor TR2 may be a driving transistor connected to the light emitting diode LED, and may include a polycrystalline semiconductor.

A first interlayer insulating layer 161 may be disposed on the second gate electrode GE2. The first interlayer insulating layer 161 may include a silicon nitride, a silicon oxide, a silicon oxynitride, or the like. The first interlayer insulating layer 161 may have a multilayer structure in which a layer including a silicon nitride and a layer including a silicon oxide are stacked. In this case, the layer containing the silicon nitride may be positioned closer to the substrate SB than the layer containing the silicon oxide.

A first semiconductor layer 135 may be disposed on the first interlayer insulating layer 161. The first semiconductor layer 135 may overlap the metal blocking layer BML.

The first semiconductor layer 135 may include an oxide semiconductor, including, for example, at least one among a primary metal oxide such as indium (In) oxide, tin (Sn) oxide, or zinc (Zn) oxide; a binary metal oxide such as In—Zn-based oxides, Sn—Zn-based oxides, Al—Zn-based oxides, Zn—Mg-based oxides, Sn—Mg-based oxides, In—Mg-based oxides, or In—Ga-based oxides; a ternary metal oxide such as In—Ga—Zn-based oxides, In—Al—Zn-based oxides, In—Sn—Zn-based oxides, Sn—Ga—Zn-based oxides, Al—Ga—Zn-based oxides, Sn—Al—Zn-based oxides, In—Hf—Zn-based oxides, In—La—Zn-based oxides, In—Ce—Zn-based oxides, In—Pr—Zn-based oxides, In—Nd—Zn-based oxides, In—Sm—Zn-based oxides, In—Eu—Zn-based oxides, In—Gd—Zn-based oxides, In—Tb—Zn-based oxides, In—Dy—Zn-based oxides, In—Ho—Zn-based oxides, In—Er—Zn-based oxides, In—Tm—Zn-based oxides, In—Yb—Zn-based oxides, or In—Lu—Zn-based oxides; and a quaternary metal oxide such as In—Sn—Ga—Zn-based oxides, In—Hf—Ga—Zn-based oxides, In—Al—Ga—Zn-based oxides, In—Sn—Al—Zn-based oxides, In—Sn—Hf—Zn-based oxides, or In—Hf—Al—Zn-based oxides. For example, the first semiconductor layer 135 may include indium-gallium-zinc oxide (IGZO) as an In—Ga—Zn-based oxide.

The first semiconductor layer 135 may include a channel region 137, and a source region 136 and a drain region 138 that are disposed on respective sides of the channel region 137. The source region 136 of the first semiconductor layer 135 may be connected to a first source electrode SE1, and the drain region 138 of the first semiconductor layer 135 may be connected to a first drain electrode DE1.

A third gate insulating layer 143 may be disposed on the first semiconductor layer 135. The third gate insulating layer 143 may include a silicon nitride, a silicon oxide, a silicon oxynitride, etc. In the embodiment of FIG. 14, the third gate insulating layer 143 may be disposed on the first semiconductor layer 135 and the first interlayer insulating layer 161. Accordingly, the third gate insulating layer 143 may cover the upper and side surfaces of the source region 136, the channel region 137, and the drain region 138 of the first semiconductor layer 135.

In the process of implementing high-resolution display device, the size of the pixels may decrease, and thus the length of a semiconductor channel may decrease. If the third gate insulating layer 143 does not cover the upper surfaces of the source region 136 and the drain region 138, some materials of the first semiconductor layer 135 may move to the side of the third gate insulating layer 143. In the present embodiment, the third gate insulating layer 143 disposed to cover the entire surface of the first semiconductor layer 135 and the first interlayer insulating layer 161 may prevent a short circuit between the first semiconductor layer 135 and a first gate electrode GE1 that may occur due to a diffusion of metal particles.

However, the present disclosure is not limited thereto, and the third gate insulating layer 143 may not cover the entire surface of the first semiconductor layer 135 and the first interlayer insulating layer 161. For example, the third gate insulating layer 143 may be disposed only between the first gate electrode GE1 and the first semiconductor layer 135. That is, the third gate insulating layer 143 may overlap the channel region 137 of the first semiconductor layer 135 but may not overlap the source region 136 and the drain region 138.

The first gate electrode GE1 may be disposed on the third gate insulating layer 143. The first gate electrode GE1 may overlap the channel region 137 of the first semiconductor layer 135 in the direction perpendicular to the substrate SB, i.e., the third direction z. The first gate electrode GE1 may include molybdenum (Mo), aluminum (Al), copper (Cu), and/or titanium (Ti), and may have a single layer or a multi-layered structure including the same. For example, the first gate electrode GE1 may include a lower layer containing titanium and an upper layer containing molybdenum, and the lower layer containing titanium may prevent diffusion of fluorine (F) used as an etching gas when dry etching the upper layer.

The first semiconductor layer 135, the first gate electrode GE1, the first source electrode SE1, and the first drain electrode DE1 may form the first transistor TR1. The first transistor TR1 may be a switching transistor for switching the second transistor TR2, and may include an oxide semiconductor.

A second interlayer insulating layer 162 may be disposed on the first gate electrode GE1. The second interlayer insulating layer 162 may include a silicon nitride, a silicon oxide, or a silicon oxynitride. The second interlayer insulating layer 162 may have a multilayer including a silicon nitride and a layer including a silicon oxide are stacked.

The first source electrode SE1 and the first drain electrode DE1, and the second source electrode SE2 and the second drain electrode DE2 may be disposed on the second interlayer insulating layer 162. Each of the first source electrode SE1, the first drain electrode DE1, the second source electrode SE2, and the second drain electrode DE2 may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu), etc., and may have a single layer or a multi-layered structure including the same. For example, each of the first source electrode SE1, the first drain electrode DE1, the second source electrode SE2, and the second drain electrode DE2 may have a tri-layer structure including a lower layer containing refractory metals such as molybdenum, chromium, tantalum, and titanium, or their alloys, an interlayer layer containing a metal with a low resistivity such as an aluminum-based metal, a silver-based metal, and a copper-based metal, and an upper layer containing a refractory metal such as molybdenum, chromium, tantalum, and titanium.

The second interlayer insulating layer 162 and the third gate insulating layer 143 may have a first opening OP1 and a second opening OP2, and the second interlayer insulating layer 162, the third gate insulating layer 143, the first interlayer insulating layer 161, the second gate insulating layer 142, and the first gate insulating layer 141 may have a third opening OP3 and a fourth opening OP4. The first opening OP1 may overlap the first source electrode SE1, the second opening OP2 may overlap the first drain electrode DE1, the third opening OP3 may overlap the second source electrode SE2, and the fourth opening OP4 may overlap the second drain electrode DE2.

The first source electrode SE1 may be connected to the source region 136 of the first semiconductor layer 135 through the first opening OP1. The first drain electrode DE1 may be connected to the drain region 138 of the first semiconductor layer 135 through the second opening OP2. The second source electrode SE2 may be connected to the source region 131 of the second semiconductor layer 130 through the third opening OP3. The second drain electrode DE2 may be connected to the drain region 133 of the second semiconductor layer 130 through the fourth opening OP4.

A first planarization layer 170 may be disposed on the first source electrode SE1, the first drain electrode DE1, the second source electrode SE2, and the second drain electrode DE2. The first planarization layer 170 may include an organic layer. For example, the first planarization layer 170 may include an organic insulating material such as a generally-used polymer (e.g., polymethylmethacrylate (PMMA) or polystyrene (PS)), a polymer derivative having a phenol-based group, an acryl-based polymer, an imide-based polymer, polyimide, an acryl-based polymer, or a siloxane-based polymer.

A connection electrode CE and the data line DL may be disposed on the first planarization layer 170. The connection electrode CE and the data line DL may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu), etc., and may have a single layer or a multi-layered structure including the same.

The first planarization layer 170 has a first contact hole 165, and the connection electrode CE is connected to the second drain electrode DE2 through the first contact hole 165.

A second planarization layer 180 may be disposed on the first planarization layer 170, the connection electrode CE, and the data line DL. The second planarization layer 180 may flatten and remove a step to increase luminous efficiency of a light emitting element to be formed thereon. The second planarization layer 180 may include an organic insulating material such as a generally-used polymer (e.g., polymethylmethacrylate (PMMA) or polystyrene (PS)), a polymer derivative having a phenol-based group, an acryl-based polymer, an imide-based polymer, polyimide, or a siloxane-based polymer.

The second planarization layer 180 has a second contact hole 185. The second contact hole 185 of the second planarization layer 180 may overlap the second drain electrode DE2.

An anode 191 may be disposed on the second planarization layer 180. The anode 191 may be connected to the second drain electrode DE2 through the second contact hole 185 of the second planarization layer 180.

The anode 191 may be provided for each pixel PX. The anode 191 may include a metal such as silver (Ag), lithium (Li), calcium (Ca), aluminum (Al), magnesium (Mg), and gold (Au), and may also include a transparent conductive oxide (TCO) such as indium tin oxide (ITO) and indium zinc oxide (IZO).

A pixel definition layer 350 may be disposed on the anode 191. The pixel definition layer 350 may include an organic insulating material such as a generally-used polymer (e.g., polymethylmethacrylate (PMMA) or polystyrene (PS)), a polymer derivative having a phenol-based group, an acryl-based polymer, an imide-based polymer, polyimide, or a siloxane-based polymer.

An opening that overlaps the anode 191 may be formed in the pixel definition layer 350. A light emitting element layer 370 may be disposed in the opening of the pixel definition layer 350.

The light emitting element layer 370 may include a material layer that uniquely emits light of a primary color such as red, green, or blue. The light emitting element layer 370 (also referred to as an emission layer EL) may have a structure in which a plurality of material layers emitting light of different colors are stacked.

A cathode 270 may be disposed on the light emitting element layer 370 and the pixel definition layer 350. The cathode 270 may be provided in common to all pixels PX and may receive a common voltage ELVSS. The cathode 270 is may include a reflective metal including calcium (Ca), barium (Ba), magnesium (Mg), aluminum (Al), silver (Ag), platinum (Pt), palladium (Pd), gold (Au), nickel (Ni), neodymium (Nd), iridium (Ir), chromium (Cr), lithium (Li), and calcium (Ca), or a transparent conductive oxide (TCO) such as indium tin oxide (ITO) and indium zinc oxide (IZO). The cathode 270 may be removed in the transmission area TA to improve the transmittance of the transmission area TA.

The anode 191, the light emitting element layer 370, and the cathode 270 may form the light emitting diode LED.

The first transistor TR1, or the switching transistor, may include an oxide semiconductor, and the second transistor TR2, or the driving transistor, may include a polycrystalline semiconductor. For high-speed driving, a movement of a motion picture or a video may be expressed more naturally by increasing a driving frequency from about 60 Hz to about 120 Hz, but it may increase the driving voltage. The frequency of driving a still image may be lowered to compensate for the increased driving voltage. For example, when driving the still image, the display device 1 may be driven at about 1 Hz. When the driving frequency is lowered in this manner, a leakage current may occur. In the display device 1 according to an embodiment, the first transistor TR1 includes an oxide semiconductor so that the leakage current may be reduced or minimized. In addition, since the second transistor TR2 includes a polycrystalline semiconductor, high electron mobility may be achieved. In other words, by making the switching transistor and the driving transistor include different semiconductor materials, the display device 1 may be driven more stably while providing high reliability.

The blocking layer BL disposed in the second pixel area PA2 may also be disposed in the wiring area WA. The gate line GL and the data line DL may be disposed in the wiring area WA. The cathode 270 may extend to the blocking layer BL, and an edge of the cathode 270 may vertically overlap an edge of the blocking layer BL.

In the transmission area TA, the first interlayer insulating layer 161, the third gate insulating layer 143, and the second interlayer insulating layer 162 that are disposed in the second pixel area PA2 may be removed. The first planarization layer 170, the second planarization layer 180, and the pixel definition layer 350 that are disposed in the second pixel area PA2 may also be removed in the transmission area TA.

The edge portion of the blocking layer BL disposed on the second pixel area PA2 may form the opening OPN of the transmission area TA. The features related to the shape of the opening OPN of the blocking layer BL and the transmission area TA according to the above-described embodiment are applicable to other embodiments of the present disclosure.

As such, the transmission area TA has the opening OPN from which the blocking layer BL disposed in the second pixel area PA2 is removed, and light may be transmitted through an optical device (e.g., the optical device 40 of FIG. 2) that may be disposed on the rear surface of the substrate SB. The optical device may be a sensor, a camera, or a flash.

An encapsulation layer 600 covering the surface of the substrate SB may be disposed on the entire region including the light emitting diode LED and the pixel definition layer 350 of the display area DA, and the transmission area TA. The encapsulation layer 600 may correspond to the encapsulation layer EN of FIG. 2.

The encapsulation layer 600 may be formed by alternately stacking at least one inorganic layer and at least one organic layer, and the inorganic layer or the organic layer may be stacked in plural. In the embodiment shown in FIG. 14, the encapsulation layer 600 includes a first inorganic encapsulation layer 610, an organic encapsulation layer 620, and a second inorganic encapsulation layer 630. The organic encapsulation layer 620 may be disposed between the first inorganic encapsulation layer 610 and the second inorganic encapsulation layer 630.

The first inorganic encapsulation layer 610 and the second inorganic encapsulation layer 630 may include a silicon nitride, a silicon oxide, a titanium oxide, or an aluminum oxide, etc., and the organic encapsulation layer 620 may include an acryl-based organic layer. However, the material(s) included in the encapsulation layer 600 is not limited thereto, and other materials may be included.

The encapsulation layer 600 may seal and protect the display device 1. A first protection layer 710 including an inorganic insulating material such as a silicon nitride and a silicon oxide may be disposed on the encapsulation layer 600.

The touch electrode TE may be disposed on the first protection layer 710. The touch electrode TE may include a metal such as aluminum (Al), copper (Cu), titanium (Ti), molybdenum (Mo), silver (Ag), chromium (Cr), nickel (Ni), etc. The touch electrode TE may have a form of a mesh with openings overlapping the light emitting units. The touch electrode TE may include a conductive nanomaterial such as silver nanowire, carbon nanotubes, etc. The touch electrode TE may include a transparent conductive material such as an ITO or an IZO.

The touch electrode TE may be electrically connected to the touch driver through wiring that may be disposed on the same layer as or on a layer that is different from the layer including the touch electrode TE. The touch electrodes TE adjacent in the first direction x or the second direction y may be electrically connected through a bridge disposed on the same layer as or on a layer that is different from the layer including the touch electrode TE. A second protection layer 720 may be disposed on the touch electrode TE to protect the touch electrode TE.

Meanwhile, the cross-sectional structure of the first pixel area PA1 of the first display area DA1 may correspond to the cross-sectional structure of the second pixel area PA2.

FIG. 15 including FIGS. 15(a) and 15(b) is a schematic view to explain a path of light of the display device 1 according to an embodiment. Referring to FIG. 15(a), the blocking layer BL disposed on the substrate SB blocks the light incident from under the substrate SB, that is, from the rear side of the substrate SB, so that the optical device 40 disposed on the rear surface of the substrate SB in the transmission area TA may be recognized by a user. A portion a1 of a light a that is incident from the rear side of the substrate SB may be absorbed to the blocking layer BL, another portion a2 of the light a may be reflected from the surface of the blocking layer BL and incident onto a side of the optical device 40. As a result, the light incident on the surface of the optical device 40 may cause interference and be recognized to the user through the optical device 40, thereby deteriorating the quality of the optical device 40.

Referring to FIG. 15(b), the display device 1 according to the embodiment includes the blocking layer BL of a dual-layer structure including the first blocking layer BL1 having the small absorption coefficient k and the second blocking layer BL2 having the large absorption coefficient k. In this case, the light incident from the outside that is incident on the optical device 40 may be prevented reflection from the blocking layer BL surface, and the interference.

In detail, a first light q of the incident light a may be reflected from the surface of the first blocking layer BL1, a second light c of the light a may be absorbed to the second blocking layer BL2 via the first blocking layer BL1, and a third light p that corresponds to a portion of the second light c may be reflected from the surface between the first blocking layer BL1 and the second blocking layer BL2.

The first blocking layer BL1 may include a material having low light reflectivity, and thereby the amount of light q reflected from the surface of the first blocking layer BL1 may be small. In addition, the light p reflected from the surface of the second blocking layer BL2 may cause interference with the light q that is reflected from the surface of the first blocking layer BL1, thereby reducing the interference.

In this manner, the blocking layer BL formed of the dual-layer structure of the first blocking layer BL1 with the small absorption coefficient k and the second blocking layer BL2 with the large absorption coefficient k may prevent the light reflected from the blocking layer BL surface from entering the optical device 40 and is recognized to a user.

In addition, the second blocking layer BL2 of the blocking layer BL including a metal having the large absorption coefficient k may absorb the light incident from the rear surface of the substrate SB such that the light may be prevented from being recognized around the transmission area TA, thereby preventing the quality deterioration that may otherwise occur due to the external light received by or emitting from the optical device 40 that is disposed at the rear surface of the substrate SB.

Figure 16:
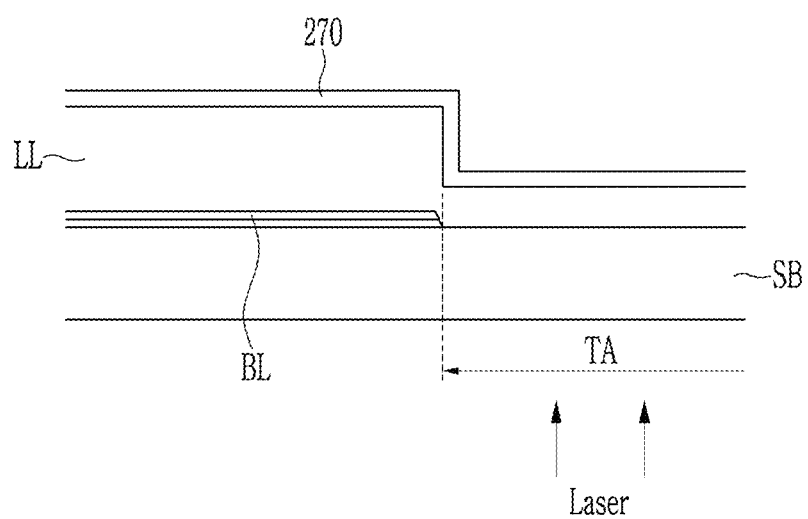
FIG. 16 is a schematic view to explain a portion of a manufacturing process of a display device according to an embodiment.

FIG. 16 is a schematic view to explain a portion of a manufacturing process of the display device 1 according to an embodiment. Referring to FIG. 16, the blocking layer BL is formed on the substrate SB, and a plurality of insulating layers and an element layer LL such as a thin film transistor (e.g., the first and second transistors T1 and T2), the anode 191, an organic emission layer (e.g., the light emitting element layer 370), etc. are formed thereon, and the cathode 270 is formed on the entire surface of the substrate SB. A laser is irradiated on the rear surface of the substrate SB using the blocking layer BL as a mask to remove a portion of the cathode 270, and the cathode 270 is removed in the transmission area TA and then the transmittance deterioration of the transmission area TA may be prevented. The blocking layer BL that includes the first blocking layer BL1 of a molybdenum oxide including tantalum or titanium may have a high heat resistance, so when the part of the cathode 270 is removed by the laser, the optical characteristic of the blocking layer BL may be maintained.

Figure 17:
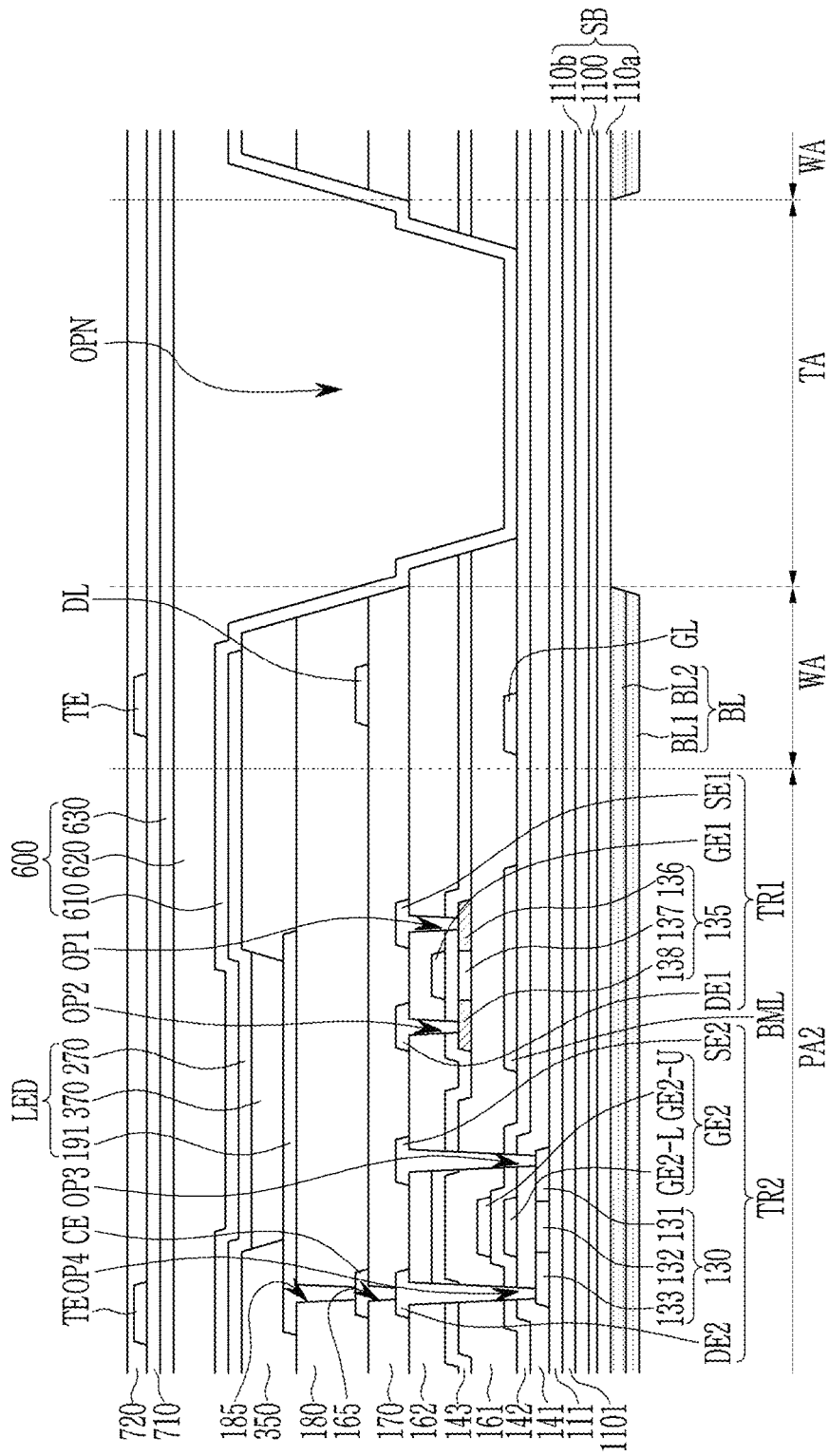
FIG. 17 is a cross-sectional view of a portion of a second display area of a display device according to another embodiment.

FIG. 17 is a cross-sectional view of a portion of the second display area DA2 of the display device 1 according to another embodiment. Referring to FIG. 17, the display device 1 is similar to the display device 1 according to the embodiment described with reference to FIG. 14. The detailed description for the same constituent elements is omitted.

In the display device 1 according to the present embodiment, unlike the display device 1 according to the embodiment shown in FIG. 14, the blocking layer BL may be disposed under the substrate SB, that is, at the rear surface of the substrate SB.

The second blocking layer BL2 of the blocking layer BL may be disposed directly under the substrate SB, and the first blocking layer BL1 may be disposed under the second blocking layer BL2.

The first blocking layer BL1 of the blocking layer BL may include a material having low reflectivity of light to prevent light incident on the optical device from being reflected from the blocking layer BL and being unnecessarily recognized. The absorption coefficient k of the second blocking layer BL2 may be greater than the absorption coefficient k of the first blocking layer BL1.

The second blocking layer BL2 of the blocking layer BL may include a metal, for example, molybdenum (Mo), aluminum (Al), titanium (Ti), copper (Cu), etc.

The blocking layer BL that includes the first blocking layer BL1 having the small absorption coefficient k and the second blocking layer BL2 having the large absorption coefficient k may prevent the light inflow from the lower part of the display device from being reflected by the blocking layer BL and inflowing to a side of the optical device 40 that may be disposed under the substrate SB.

Accordingly, the blocking layer BL may prevent the light reflected from the blocking layer BL surface from interfering with the light directly incident on the optical device 40, thereby preventing the quality deterioration of the optical device 40 positioned on the rear surface of the substrate SB due to the external light. In addition, the second blocking layer BL2 of the blocking layer BL that includes a metal having the large absorption coefficient may absorb the light incident from the rear surface of the substrate SB such that the light may be prevented from being recognized around the transmission area TA.

Figure 18:
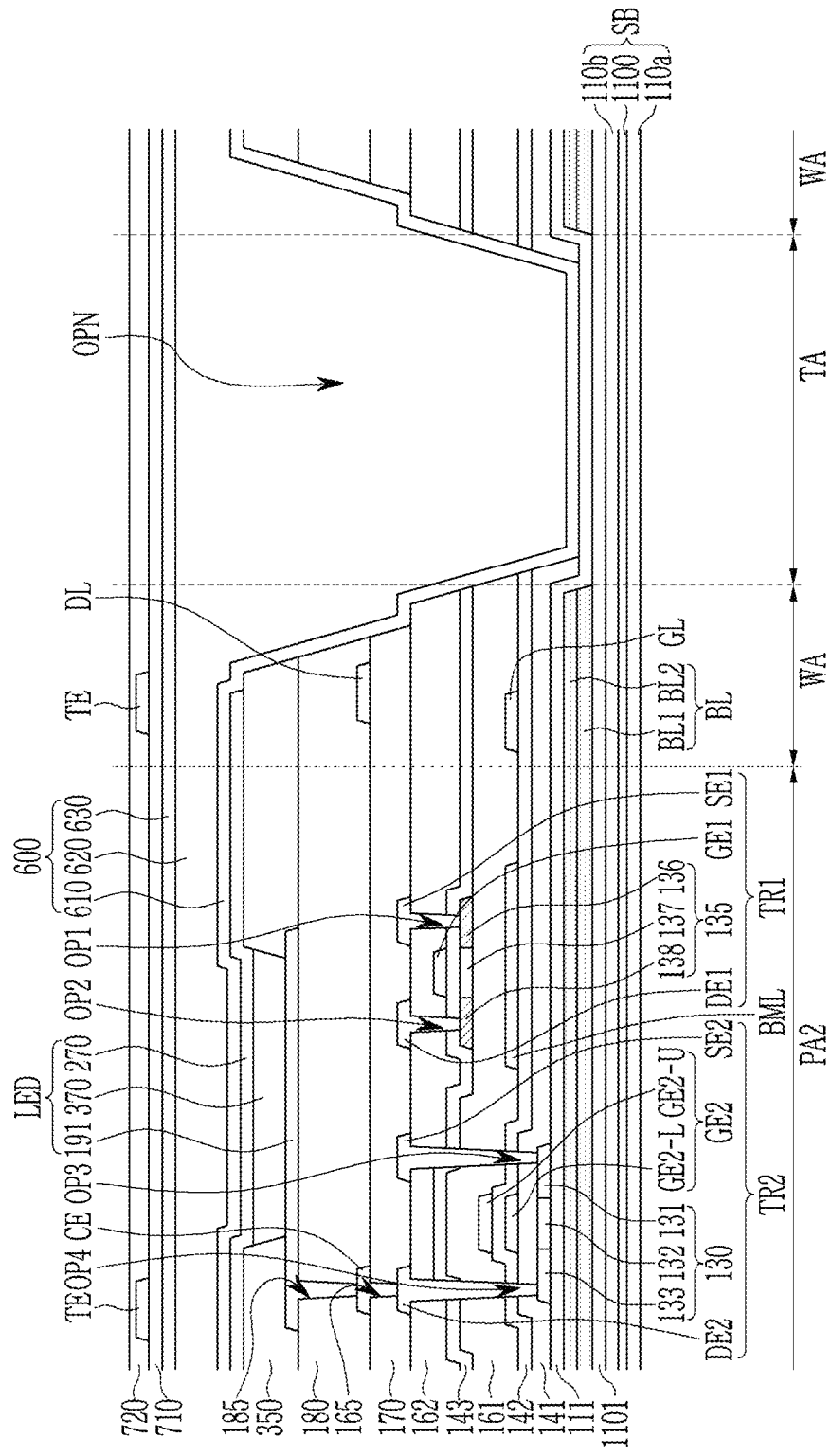
FIG. 18 is a cross-sectional view of a portion of a second display area of a display device according to another embodiment.

FIG. 18 is a cross-sectional view of a portion of the second display area DA2 of the display device 1 according to another embodiment. Referring to FIG. 18, the display device 1 is similar to the display device 1 according to the embodiment shown in FIG. 14. The detailed description for the same constituent element is omitted.

In the display device 1 according to the present embodiment, unlike the display device 1 according to the embodiment shown in FIG. 14, the first gate insulating layer 141 and the second gate insulating layer 142 that are disposed in the second pixel area PA2 may be removed in the transmission area TA, and an edge portion of the first gate insulating layer 141 and the second gate insulating layer 142 along with the edge portion of the first interlayer insulating layer 161, the third gate insulating layer 143, and the second interlayer insulating layer 162 may overlap the edge of the transmission area TA.

By additionally removing the first gate insulating layer 141 and the second gate insulating layer 142 in the transmission area TA, the transmittance of light in the transmission area TA may be further increased.

The blocking layer BL disposed on the substrate SB in the second pixel area PA2 and the wiring area WA may prevent the deterioration of the optical device 40 due to light scattering that may occur by an inflow of the external light in the second display area DA2 except for the transmission area TA.

Figure 19:
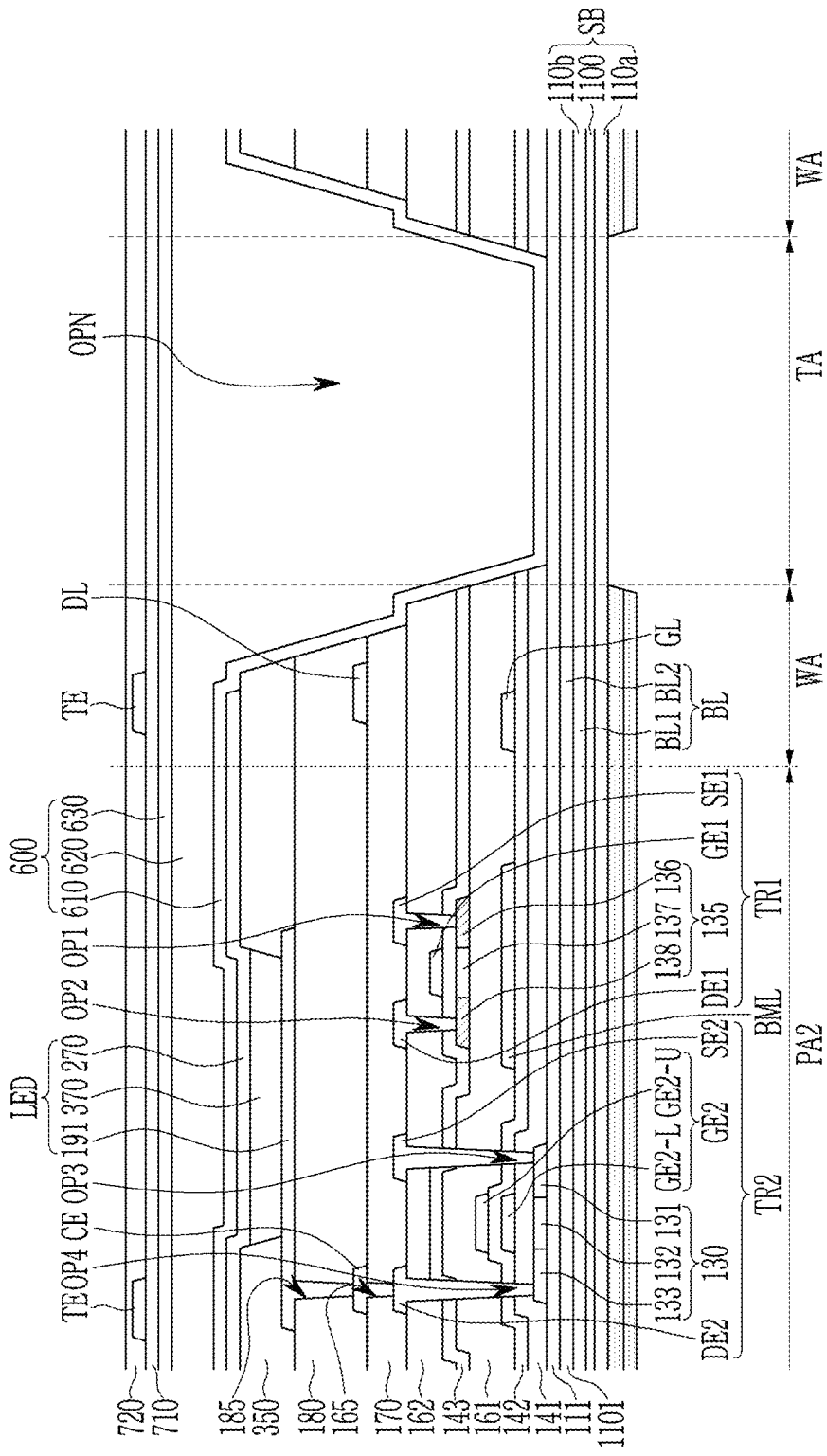
FIG. 19 is a cross-sectional view of a portion of a second display area of a display device according to another embodiment.

FIG. 19 is a cross-sectional view of a portion of the second display area DA2 of the display device 1 according to another embodiment. Referring to FIG. 19, the display device 1 is similar to the display device 1 according to the embodiment described with reference to FIG. 14. The detailed description of the same constituent element is omitted.

In the display device 1 according to the present embodiment, unlike the embodiment described with reference to FIG. 14, the first gate insulating layer 141 and the second gate insulating layer 142 that are disposed in the second pixel area PA2 may be removed in the transmission area TA, and the edge portion of the first gate insulating layer 141 and the second gate insulating layer 142 along with the edge portion of the first interlayer insulating layer 161, the third gate insulating layer 143 and the second interlayer insulating layer 162 may overlap the edge of the transmission area TA.

Also, in the display device 1 according to the present embodiment, unlike the display device 1 according to the embodiment shown in FIG. 14, the blocking layer BL may be disposed under the substrate SB, that is, at the rear of the substrate SB.

The second blocking layer BL2 of the blocking layer BL may be disposed directly on the substrate SB, and the first blocking layer BL1 may be disposed under the second blocking layer BL2.

Figure 20:
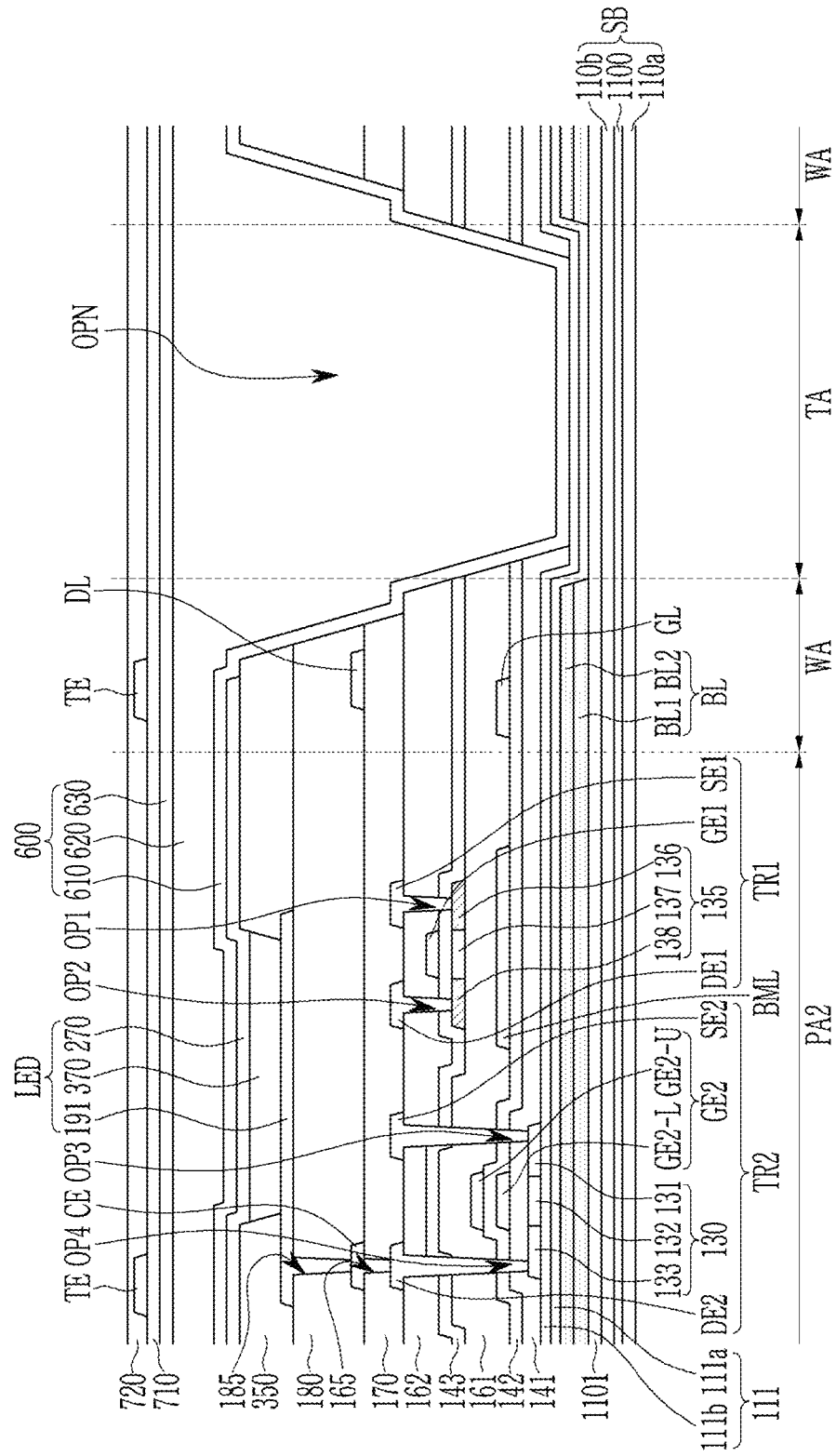
FIG. 20 is a cross-sectional view of a portion of a second display area of a display device according to another embodiment.

FIG. 20 is a cross-sectional view of a portion of the second display area DA2 of the display device 1 according to another embodiment. Referring to FIG. 20, the display device 1 is similar to the display device 1 according to the embodiment described with reference to FIG. 14. The detailed description of the same constituent element is omitted.

In the display device 1 according to the present embodiment, unlike the display device 1 according to the embodiment shown in FIG. 14, the first gate insulating layer 141 and the second gate insulating layer 142 that are disposed in the second pixel area PA2 may be removed in the transmission area TA, and the first gate insulating layer 141 and the second gate insulating layer 142 along with the first interlayer insulating layer 161, the third gate insulating layer 143, and the second interlayer insulating layer 162 may be removed in the transmission area TA.

Also, in the display device 1 according to the present embodiment, unlike the display device 1 according to the embodiment shown in FIG. 14, the buffer layer 111 disposed on the blocking layer BL may include a first buffer layer 111a and a second buffer layer 111b.

The buffer layer 111 that includes the first buffer layer 111a and the second buffer layer 111b may maintain the entire thickness of the buffer layer 111 while increasing the contact characteristic between the layer formed under the buffer layer 111 and the layer formed thereon and reducing the refractive index difference therebetween. For example, the first buffer layer 111a may include a silicon nitride, and the second buffer layer 111b may include a silicon oxide.

The buffer layer 111 that includes the first buffer layer 111a and the second buffer layer 111b may prevent inflow of moisture from the outside and increase the transmittance of light in the transmission area TA.

Figure 21:
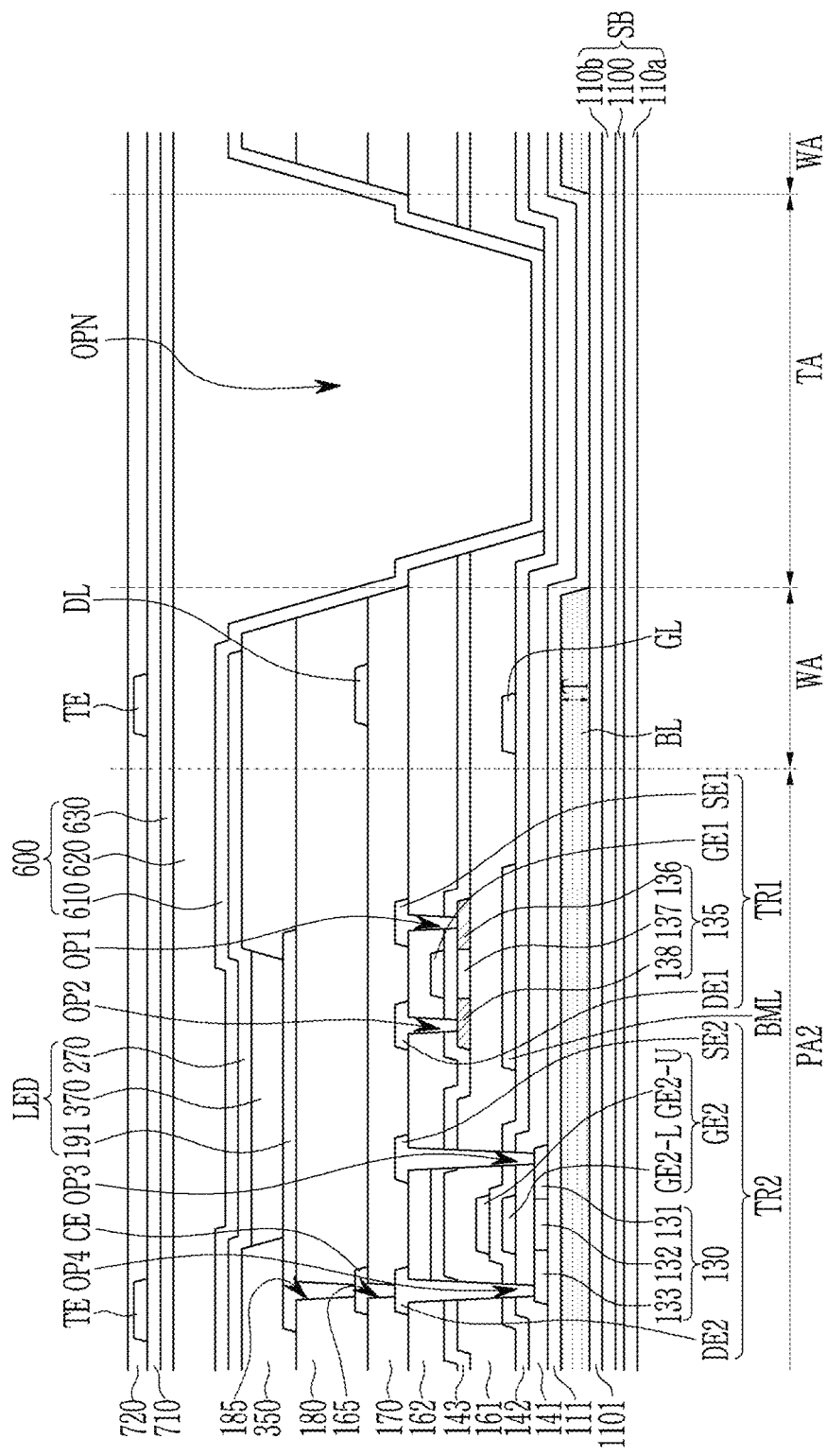
FIG. 21 is a cross-sectional view of a portion of a second display area of a display device according to another embodiment.

FIG. 21 is a cross-sectional view of a portion of the second display area DA2 of the display device 1 according to another embodiment. Referring to FIG. 21, the display device 1 is similar to the display device 1 according to the embodiment described with reference to FIG. 14. The detailed description of the same constituent elements is omitted.

In the display device 1 according to the present embodiment, unlike the display device according to the embodiment shown in FIG. 14, the blocking layer BL is formed of a single layer.

The thickness T of the blocking layer BL may be about 2000 Å or more. Even if the blocking layer BL is formed as a single layer containing a molybdenum oxide, the blocking layer BL having a thickness of about 2000 Å or more may block light while preventing the reflection of the light.

Figure 22:
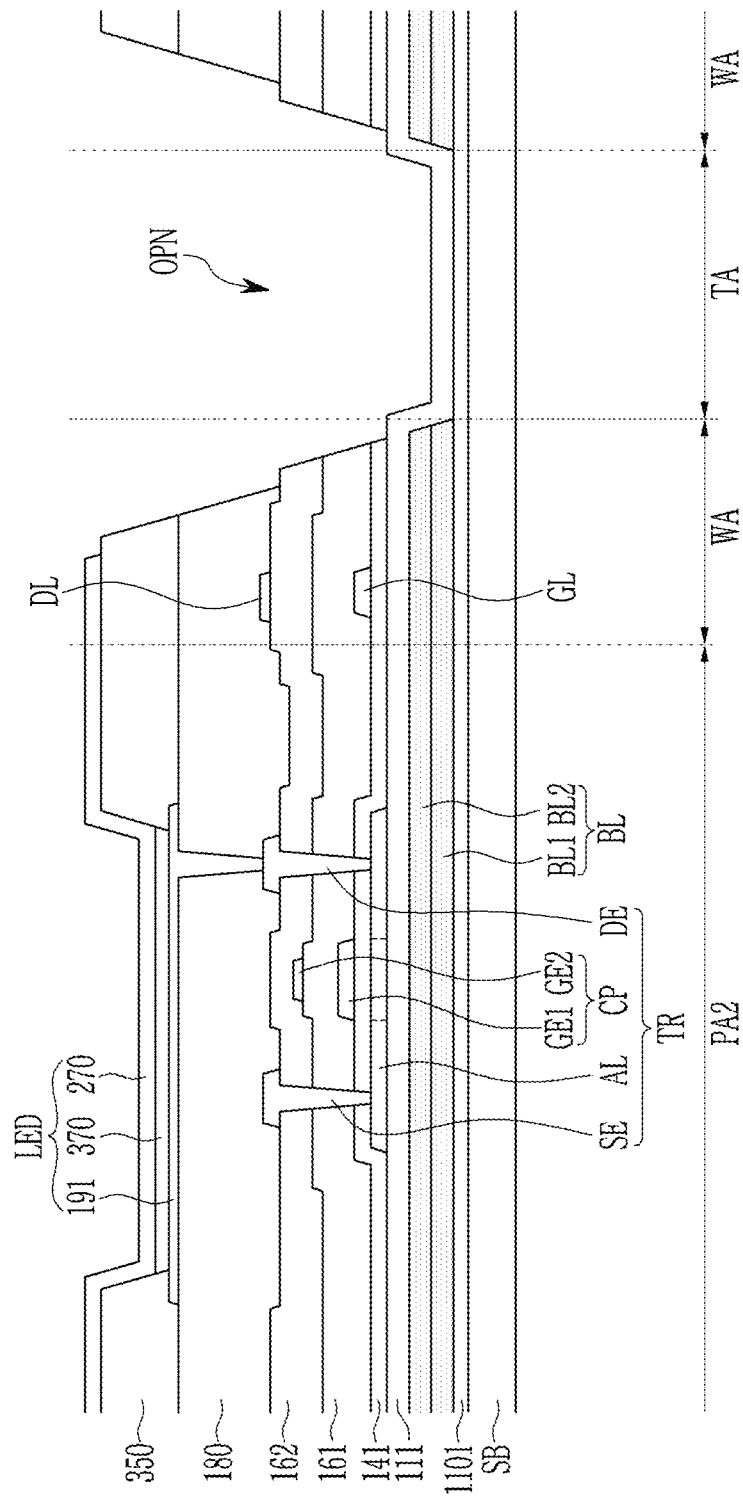
FIG. 22 is a cross-sectional view of a portion of a second display area of a display device according to another embodiment.

FIG. 22 is a cross-sectional view of a portion of the second display area DA2 of the display device 1 according to another embodiment. Referring to FIG. 22, the display device 1 includes several layers, wires, and elements formed on the substrate SB. The elements may include a transistor TR, a capacitor CP, and the light emitting diode LED. The substrate SB may include an insulating material such as glass and may be optically transparent.

A semiconductor layer AL of the transistor TR may be disposed on the buffer layer 111. The semiconductor layer AL may include a channel region, and a source region and a drain region that are disposed on respective sides of the channel region. The semiconductor layer AL may include polysilicon. Also, the semiconductor layer AL may include a semiconductor material such as amorphous silicon, an oxide semiconductor, etc.

The first gate insulating layer 141 including an inorganic insulating material may be disposed on the semiconductor layer AL. For example, the first gate insulating layer 141 may have a single layer or a multi-layered structure including a silicon nitride, a silicon oxide, a silicon oxynitride, or the like.

On the first gate insulating layer 141, a first conductor layer including a first gate electrode GE of the transistor TR, the gate line GL may be disposed. The first gate electrode GE may overlap the channel region of the semiconductor layer AL. The first conductor layer is a single layer or a multi-layered structure including metals such as molybdenum (Mo), copper (Cu), aluminum (Al), silver (Ag), chromium (Cr), tantalum (Ta), and titanium (Ti).

The first interlayer insulating layer 161 may be disposed on the first conductor layer. The first interlayer insulating layer 161 may include a silicon nitride, a silicon oxide, a silicon oxynitride, etc.

A second conductor layer that includes the second gate electrode GE2 overlapping the first gate electrode GE1 may be disposed on the first interlayer insulating layer 161. The second conductor layer may include a metal such as molybdenum (Mo), copper (Cu), aluminum (Al), silver (Ag), chromium (Cr), tantalum (Ta), titanium (Ti), or the like.

The second interlayer insulating layer 162 may be disposed on the second conductor layer. The second interlayer insulating layer 162 may include a silicon nitride, a silicon oxide, a silicon oxynitride, or the like. The second interlayer insulating layer 162 may be formed of a multilayer in which a layer including a silicon nitride and a layer including a silicon oxide are stacked.

On the second interlayer insulating layer 162, a third conductor layer including a source electrode SE and a drain electrode DE of the transistor TR, the data line DL, a driving voltage line, or the like may be disposed. The source electrode SE and the drain electrode DE may be respectively connected to a source region and a drain region of the semiconductor layer AL through respective contact holes formed in the first interlayer insulating layer 161 and the second interlayer insulating layer 162. The third conductor layer may include aluminum (Al), platinum (Pt), palladium (Pd), silver (Ag), magnesium (Mg), gold (Au), neodymium (Nd), iridium (Ir), chromium (Cr), nickel (Ni), calcium (Ca), molybdenum (Mo), tungsten (W), titanium (Ti), chromium (Cr), tantalum (Ta), and/or copper (Cu), etc., and may be a single layer or a multi-layered structure. For example, the third conductor layer may have a tri-layer structure including a lower layer containing a refractory metal such as molybdenum, chromium, tantalum, and titanium, or their alloys, an interlayer layer having low resistivity such as an aluminum-based metal, a silver-based metal, and a copper-based metal, and an upper layer containing a refractory metal such as molybdenum, chromium, tantalum, and titanium.

The gate electrode GE, the source electrode SE, and the drain electrode DE form the transistor TR together with the semiconductor layer AL. The first gate electrode GE1 and the second gate electrode GE2 may form the capacitor CP along with the first interlayer insulating layer 161 interposed between them. A pixel circuit including the transistor TR and the capacitor CP may be disposed in the second pixel area PA2, but may not be disposed in the transmission area TA.

The second planarization layer 180 that may include an organic insulating material may be disposed on the second interlayer insulating layer 162 and the third conductor layer. The second planarization layer 180 may remove the step and flatten a surface to increase the light emission efficiency of the light emitting element to be formed thereon. For example, the second planarization layer 180 may include an organic insulating material such as a generally-used polymer (e.g., polymethylmethacrylate (PMMA) or polystyrene (PS)), a polymer derivative having a phenol-based group, an acryl-based polymer, an imide-based polymer, polyimide, an acryl-based polymer, or a siloxane-based polymer.

The anode 191 of the light emitting diode LED of the pixel PX may be disposed on the second planarization layer 180. The anode 191 may be provided for each pixel PX. The anode 191 may include a metal such as silver (Ag), lithium (Li), calcium (Ca), aluminum (Al), magnesium (Mg), and gold (Au), and may also include a transparent conductive oxide (TCO) such as indium tin oxide (ITO), indium zinc oxide (IZO).

The pixel definition layer 350 may be disposed on the anode 191. The pixel definition layer 350 may include an organic insulating material such as a generally-used polymer (e.g., polymethylmethacrylate (PMMA) or polystyrene (PS)), a polymer derivative having a phenol-based group, an acryl-based polymer, an imide-based polymer, polyimide, an acryl-based polymer, or a siloxane-based polymer.

An opening overlapping the anode 191 may be formed in the pixel definition layer 350. The light emitting element layer 370 may be disposed in the opening of the pixel definition layer 350.

The light emitting element layer 370 may include a material layer that uniquely emits light of a primary colors such as red, green, or blue. The light emitting element layer 370 may have a structure in which a plurality of material layers emitting light of different colors are stacked.

The cathode 270 may be disposed on the light emitting element layer 370 and the pixel definition layer 350. The cathode 270 may be provided in common to all pixels PX and may receive a common voltage ELVSS. The cathode 270 may include a reflective metal including calcium (Ca), barium (Ba), magnesium (Mg), aluminum (Al), silver (Ag), platinum (Pt), palladium (Pd), gold (Au), nickel (Ni), neodymium (Nd), iridium (Ir), chromium (Cr), lithium (Li), and calcium (Ca), or a transparent conductive oxide (TCO) such as indium tin oxide (ITO) and indium zinc oxide (IZO).

The cathode 270 may be removed in the transmission area TA to improve transmittance of the transmission area TA.

The anode 191, the light emitting element layer 370, and the cathode 270 may form the light emitting diode LED.

The blocking layer BL disposed in the second pixel area PA2 may also be disposed in the wiring area WA. The gate line GL and the data line DL may be disposed in the wiring area WA.

In the transmission area TA, the first gate insulating layer 141, the first interlayer insulating layer 161 and the second interlayer insulating layer 162, the second planarization layer 180, and the pixel definition layer 350 disposed in the second pixel area PA2 may be removed.

The edge portion of the blocking layer BL disposed in the second pixel area PA2 may form the opening OPN of the transmission area TA.

The features regarding the shape of the blocking layer BL and the opening OPN of the transmission area TA according to the above-described embodiment are applicable to other embodiments of the present disclosure.

The transmission area TA may have the opening OPN from which the blocking layer BL disposed in the second pixel area PA2 is removed, and the light may be transmitted through an optical device (e.g., the optical device 40 of FIG. 2) that may be disposed on the rear surface of the substrate SB. The optical device may be a sensor, camera, or a flash.

Also, in the transmission area TA where the blocking layer BL is removed, the first gate insulating layer 141, the first interlayer insulating layer 161, and the second interlayer insulating layer 162 that may be the inorganic insulating layer may also be removed along with the second planarization layer 180 and the pixel definition layer 350 that may be the organic insulator, and the transmittance of light in the transmission area TA may be increased.

Although not shown, a thin film encapsulation layer (e.g., the encapsulation layer EN of FIG. 2, the encapsulation layer 600 of FIG. 14) or an encapsulation substrate entirely covering the substrate SB may be disposed on the entire region including the light emitting diode LED of the display area DA, the pixel definition layer 350, and the transmission area TA. In a case where the encapsulation substrate is disposed, a glass frit may be used.

Also, although not shown, a touch substrate including a touch layer (e.g., the touch sensor layer TS of FIG. 2) or touch wirings may be disposed on the thin film encapsulation layer or the encapsulation substrate.

Meanwhile, the cross-sectional structure of the first pixel area PA1 of the first display area DA1 may correspond to the cross-sectional structure of the second pixel area PA2.

Figure 23:
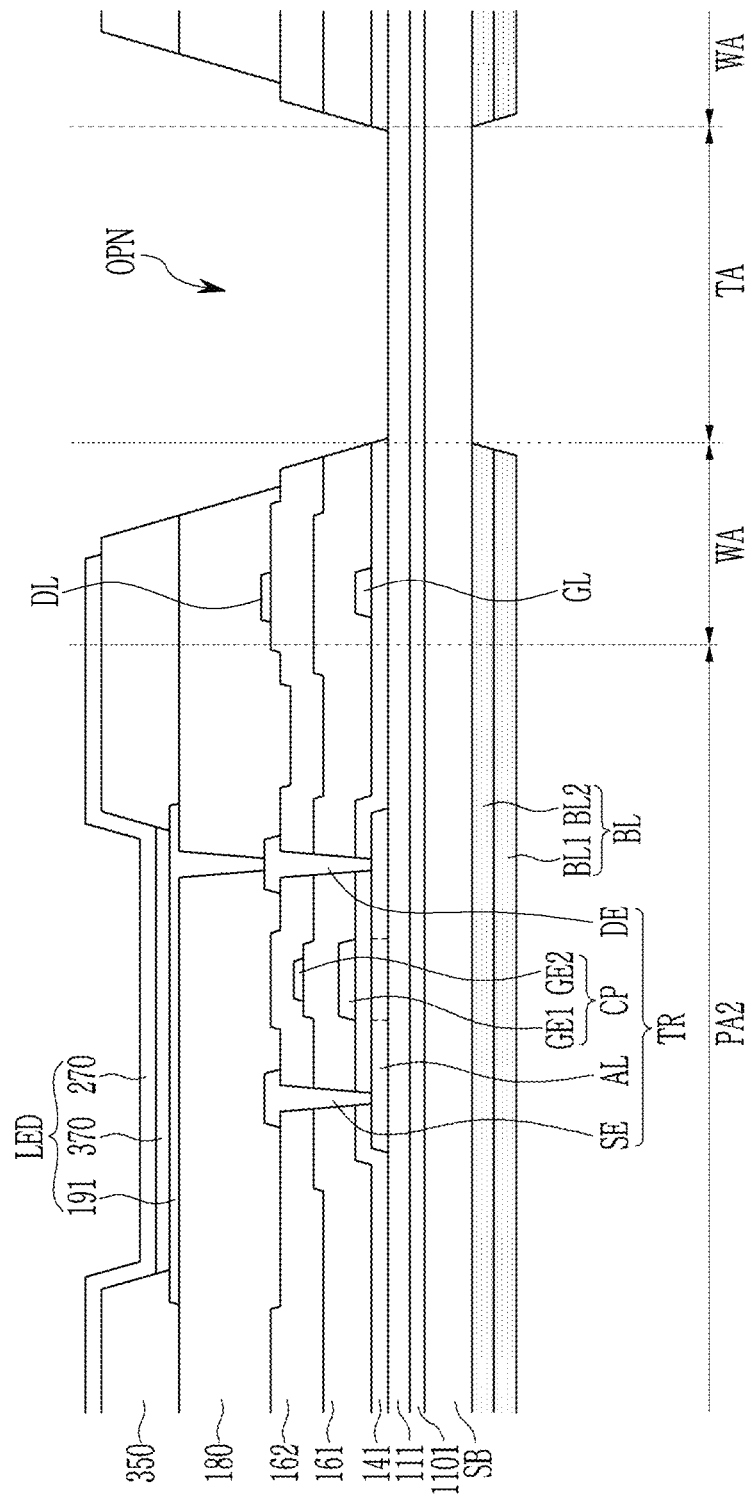
FIG. 23 is a cross-sectional view of a portion of a second display area of a display device according to another embodiment.

FIG. 23 is a cross-sectional view of a portion of the second display area DA2 of the display device 1 according to another embodiment. Referring to FIG. 23, the display device 1 is similar to the display device according to the embodiment described above with reference to FIG. 22. The detailed description of the same constituent elements is omitted.

Also, in the display device 1 according to the present embodiment, unlike the display device 1 according to the embodiment shown in FIG. 22, the blocking layer BL may be disposed under the substrate SB, that is, at the rear of the substrate SB. The second blocking layer BL2 of the blocking layer BL may be disposed directly under the substrate SB, and the first blocking layer BL1 may be disposed under the second blocking layer BL2.

The absorption coefficient k of the second blocking layer BL2 may be greater than the absorption coefficient k of the first blocking layer BL1.

The reflectivity n of the second blocking layer BL2 may be greater than the reflectivity n of the first blocking layer BL1.

Since the first blocking layer BL1 of the blocking layer BL includes the material having low reflectivity of light, light incident on the optical device 40 may be prevented from being reflected by the blocking layer BL and being unnecessarily recognized.

In addition, the second blocking layer BL2 of the blocking layer BL that includes a metal having the large absorption coefficient may absorb the light incident from the rear surface of the substrate SB to prevent the light from being recognized around the transmission area TA.

Figure 24:
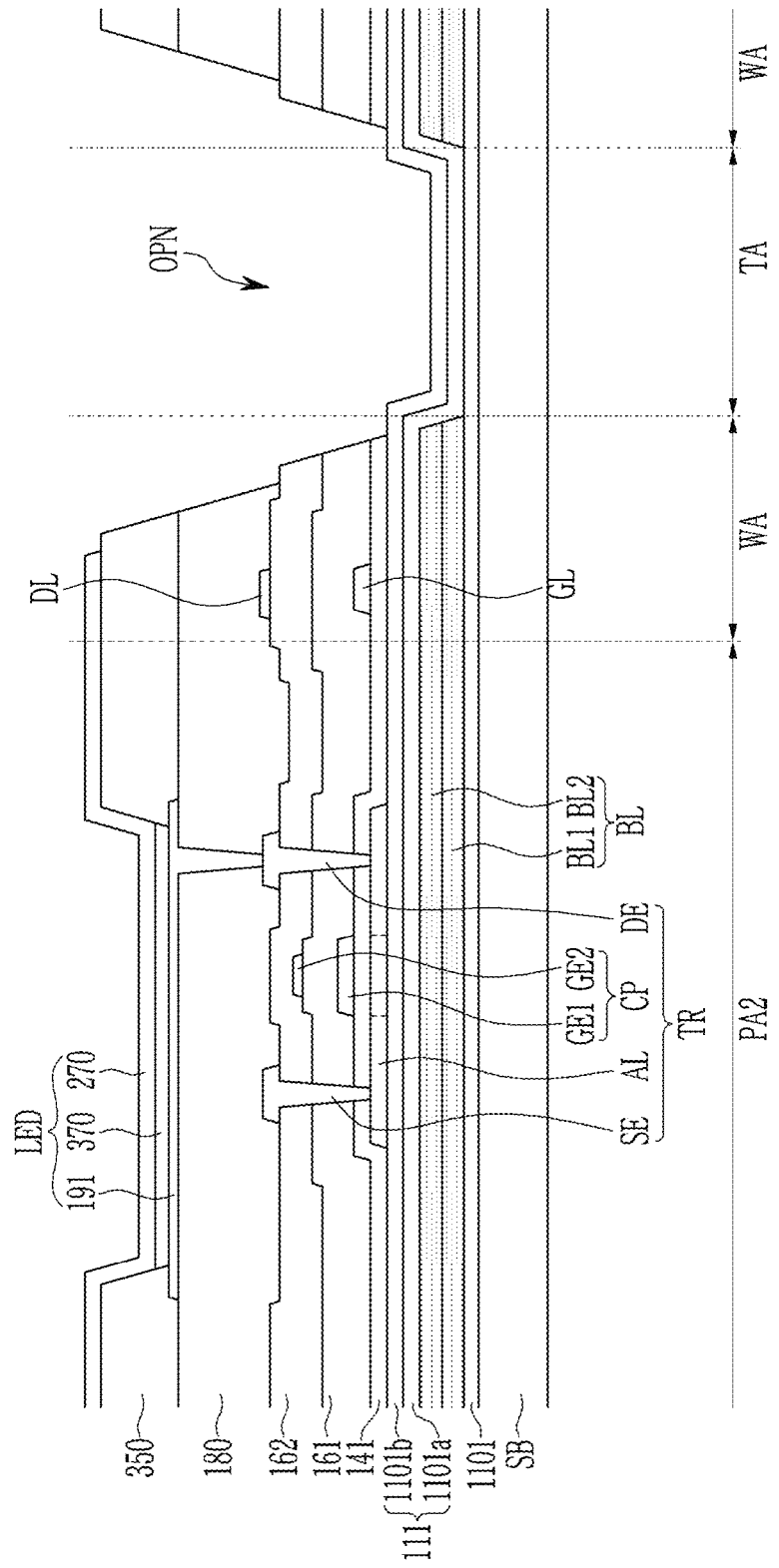
FIG. 24 is a cross-sectional view of a portion of a second display area of a display device according to another embodiment.

FIG. 24 is a cross-sectional view of a portion of the second display area DA2 of the display device 1 according to another embodiment. Referring to FIG. 24, the display device 1 is similar to the display device 1 according to the embodiment described with reference to FIG. 22. The detailed description of the same constituent elements is omitted.

In the display device 1 according to the present embodiment, unlike the display device 1 according to the embodiment shown in FIG. 22, the buffer layer 111 disposed on the blocking layer BL may include the first buffer layer 111a and the second buffer layer 111b.

The buffer layer 111 that includes the first buffer layer 111a and the second buffer layer 111b may maintain the entire thickness of the buffer layer 111 while increasing the contact characteristic between the layer formed under the buffer layer 111 and the layer formed thereon and reducing the refractive index difference there between. For example, the first buffer layer 111a may include a silicon nitride and the second buffer layer 111b may include a silicon oxide.

The buffer layer 111 that includes the first buffer layer 111a and the second buffer layer 111b may prevent inflow of moisture from the outside and increase the transmittance of light in the transmission area TA.

Figure 25:
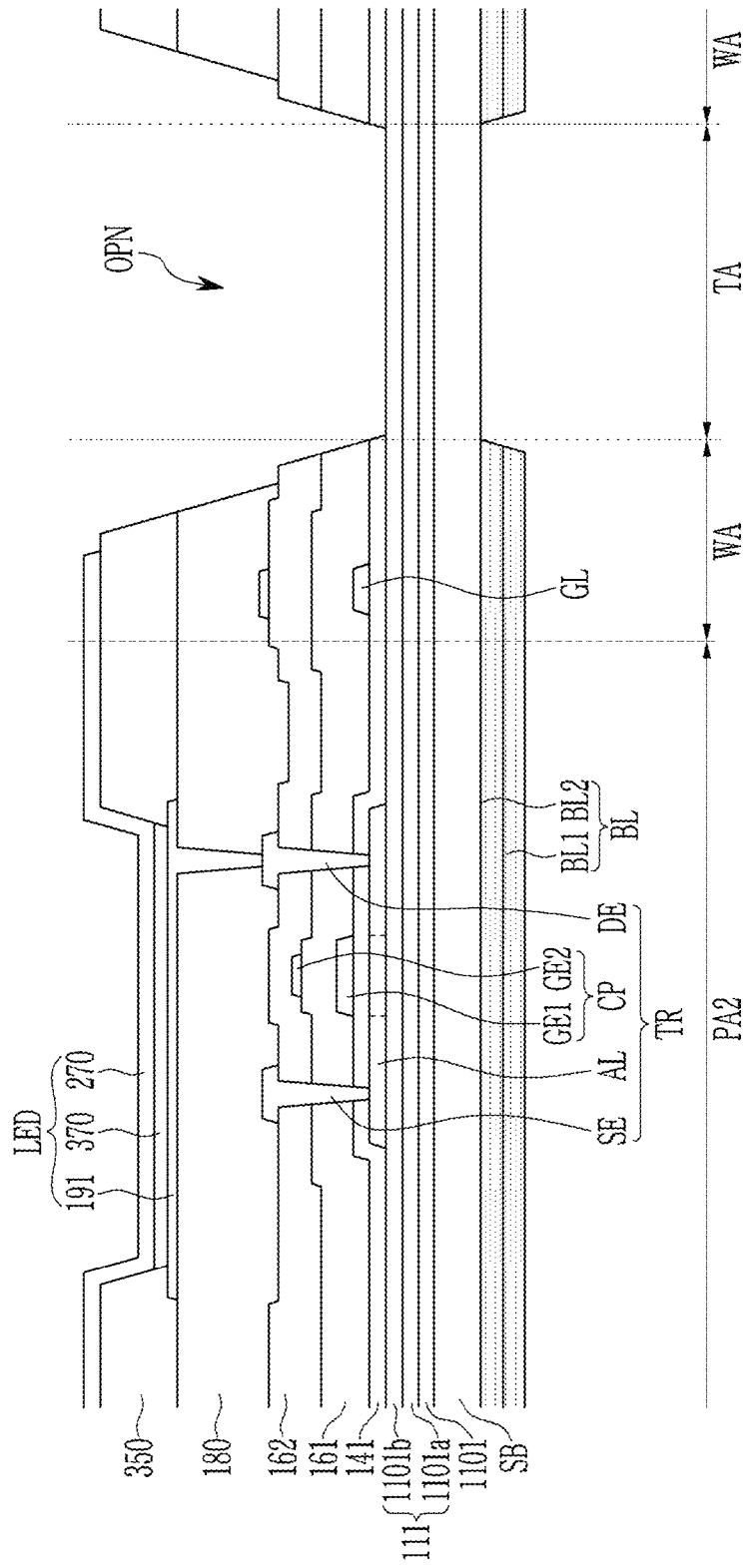
FIG. 25 is a cross-sectional view of a portion of a second display area of a display device according to another embodiment.

FIG. 25 is a cross-sectional view of a portion of the second display area DA2 of the display device 1 according to another embodiment. Referring to FIG. 25, the display device 1 is similar to the display device 1 according to the embodiment described with reference to FIG. 22. The detailed description of the same constituent elements is omitted.

In the display device 1 according to the present embodiment, unlike the display device 1 according to the embodiment shown in FIG. 22, the buffer layer 111 disposed on the blocking layer BL may include the first buffer layer 111a and the second buffer layer 111b. Also, in the display device 1 according to the present embodiment, unlike the display device 1 according to the embodiment shown in FIG. 22, the blocking layer BL may be disposed under the substrate SB, that is, at the rear of the substrate SB.

The second blocking layer BL2 of the blocking layer BL may be disposed directly under the substrate SB, and the first blocking layer BL1 may be disposed under the second blocking layer BL2.

Figure 26:
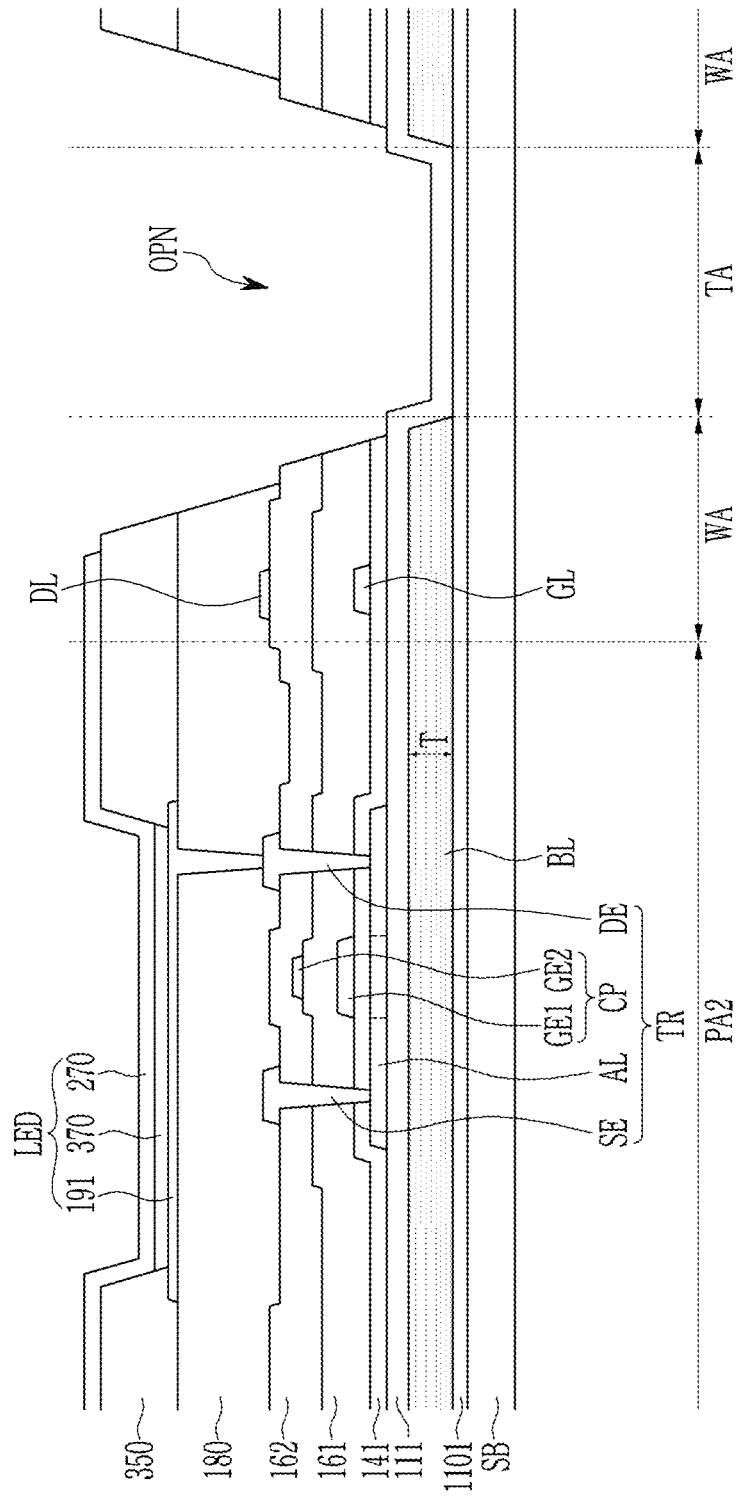
FIG. 26 is a cross-sectional view of a portion of a second display area of a display device according to another embodiment.

FIG. 26 is a cross-sectional view of a portion of t second display area DA2 of the display device 1 according to another embodiment. Referring to FIG. 26, the display device 1 is similar to the display device 1 according to the embodiment described with reference to FIG. 22. The detailed description of the same constituent elements is omitted.

In the display device 1 according to the present embodiment, unlike the display device according to the embodiment shown in FIG. 22, the blocking layer BL may be formed of a single layer.

The thickness T of the blocking layer BL may be about 2000 Å or more. Even if the blocking layer BL is formed as a single layer containing a molybdenum oxide, the blocking layer BL having a thickness of about 2000 Å or more may block light while preventing the reflection of the light.

Figure 27:
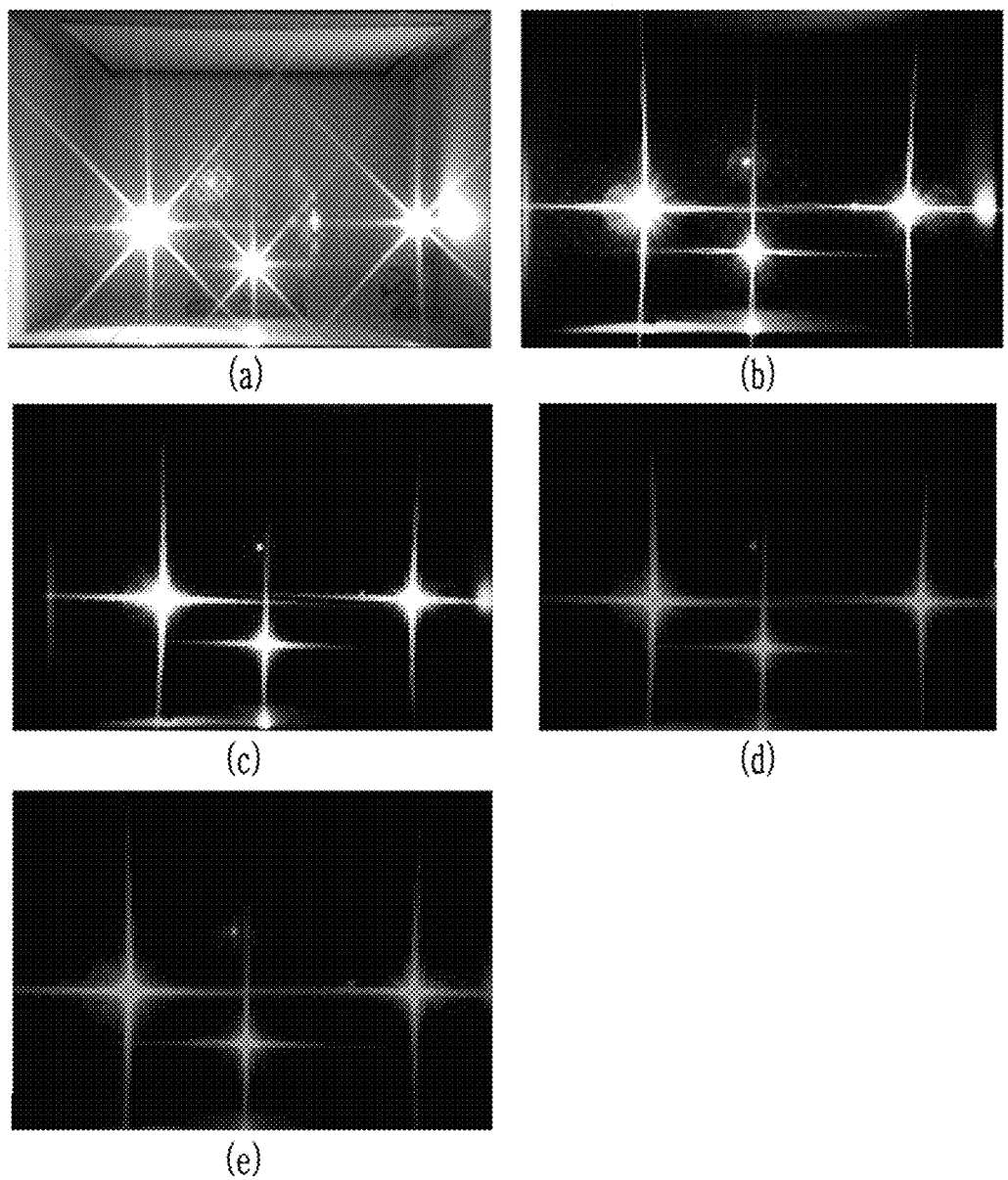
FIG. 27 is an electron micrograph showing a result according to an experimental example.

FIG. 27 is an electron micrograph showing a result according to an experimental example. In the experimental example, reflectivity is measured and shown in Table 1 below for five different cases; a first case (a) of forming the blocking layer BL of a single layer including a metal, a second case (b) of forming the blocking layer BL including the first blocking layer BL1 made of a metal oxide and the second blocking layer BL2 made of a metal layer, a third case (c) of forming the blocking layer BL including the first blocking layer BL1 made of a metal oxide and the second blocking layer BL2 made of a metal layer, and forming the second barrier layer 1101 including a silicon oxynitride, a fourth case (d) of forming the blocking layer BL including the first blocking layer BL1 made of a black organic layer and the second blocking layer BL2 made of a metal layer, and forming the second barrier layer 1101 including a silicon oxynitride, and a fifth case (e) of forming the blocking layer BL including the first blocking layer BL1 made of amorphous silicon and the second blocking layer BL2 made of a metal layer, and forming the second barrier layer 1101 including a silicon oxynitride. The reflected light for each of the five cases is measured and shown in FIG. 27 as a photographic image.

TABLE 1

|  | First case | Second case | Third case | Fourth case | Fifth case |
| --- | --- | --- | --- | --- | --- |
| Reflectivity (average, %) | 24.36 | 12.84 | 7.6 | 4.8 | 9.2 |

Referring to FIG. 27 along with Table 1, compared with the first case in which the blocking layer BL is formed of a single layer of metal, the cases of forming the blocking layer to include the first blocking layer BL1 and the second blocking layer BL2, the average reflectivity is largely reduced, and the reflected light is not recognized.

Figure 28A:
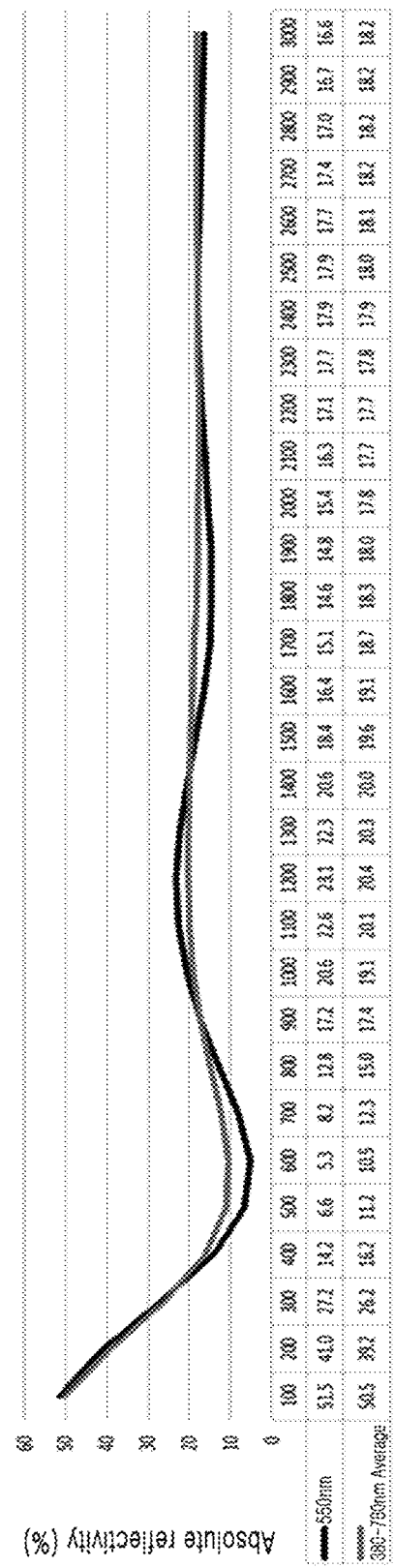
FIG. 28A, FIG. 28B, and FIG. 28C are graphs showing a result according to an experimental example.
Figure 28B:
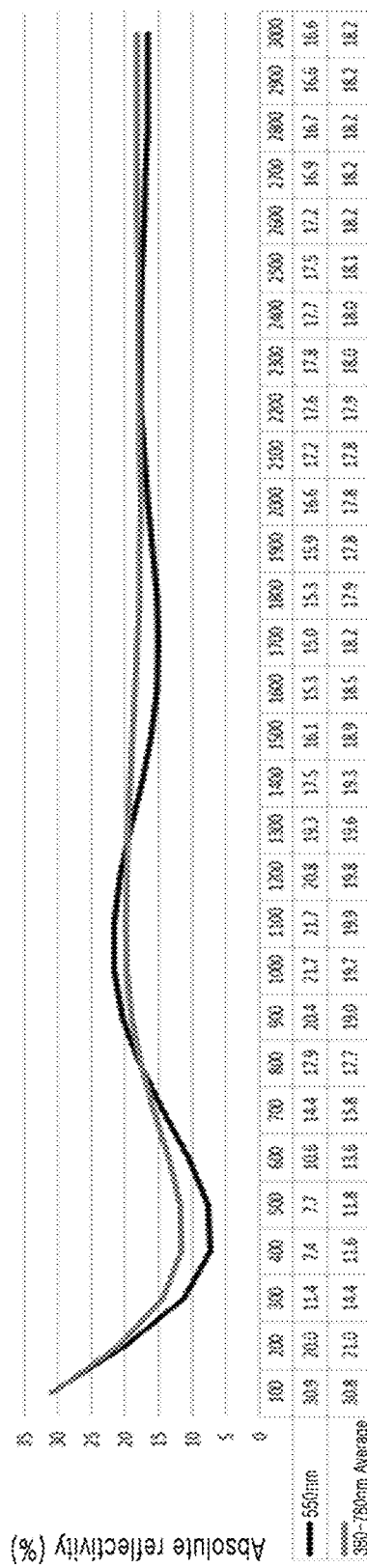
Figure 28C:
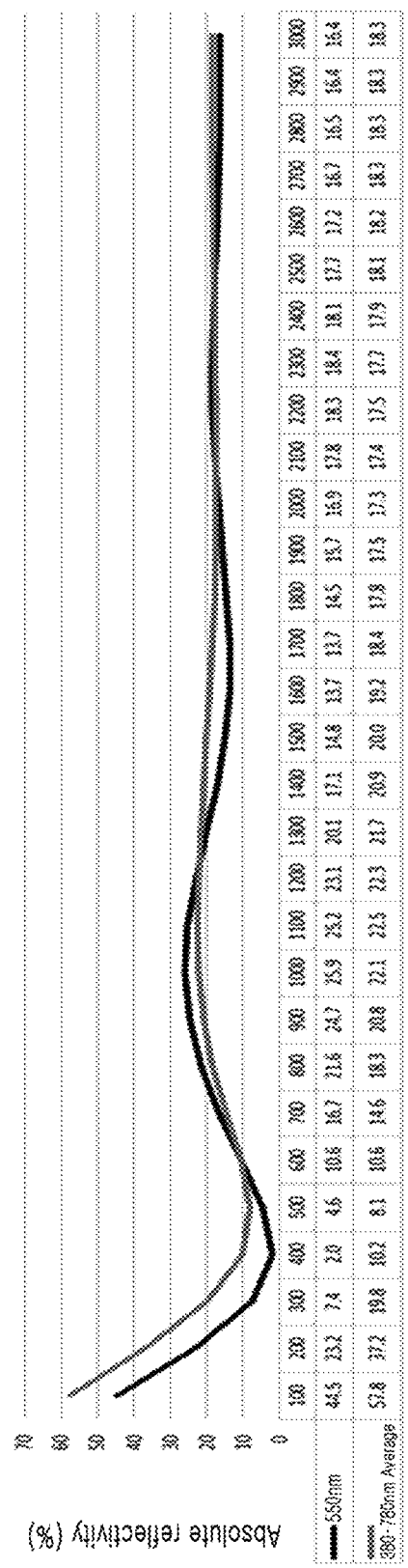

FIG. 28A to FIG. 28C are graphs showing a result according to an experimental example. According to the embodiments of the display device 1, the blocking layer BL includes the first blocking layer BL1 made of the metal oxide and the second blocking layer BL2 made of the metal layer. The first blocking layer BL1 may be formed of a molybdenum-titanium oxide, and the second blocking layer BL2 may be formed of molybdenum (Mo), titanium (Ti), and copper (Cu), respectively. The transmittance of light is measured while changing the thickness of the first blocking layer BL and is shown in FIG. 28A to FIG. 28C. FIG. 28A shows the result of the case of the second blocking layer formed of molybdenum, FIG. 28B shows the result of the case of the second blocking layer formed of titanium, and FIG. 28C shows the result of the case of the second blocking layer formed of copper.

Referring to FIG. 28A to FIG. 28C, the reflectivity is not great even when the thickness of the first blocking layer BL1 is not formed significantly thick, but is formed only to be about 300 Å or more. As described above, the reflectivity of the blocking layer BL may be maintained below a certain value regardless of which metal is included in the second blocking layer BL2.

Figure 29A:
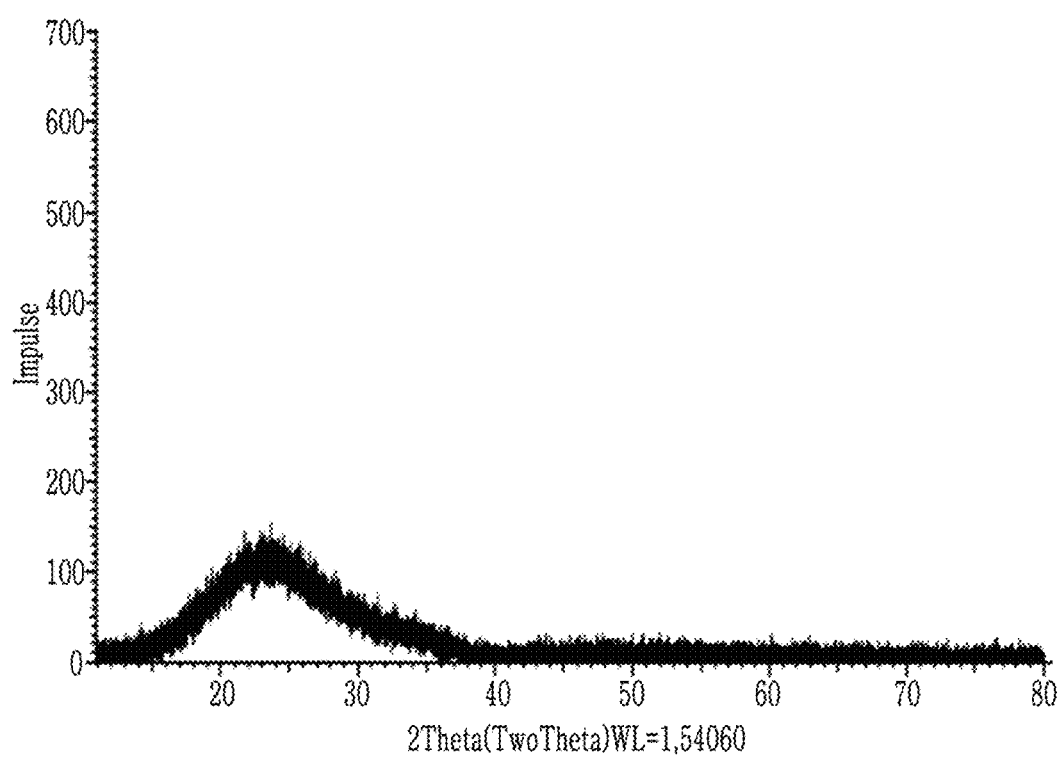
FIG. 29A and FIG. 29B are graphs showing a result according to an experimental example.
Figure 29B:
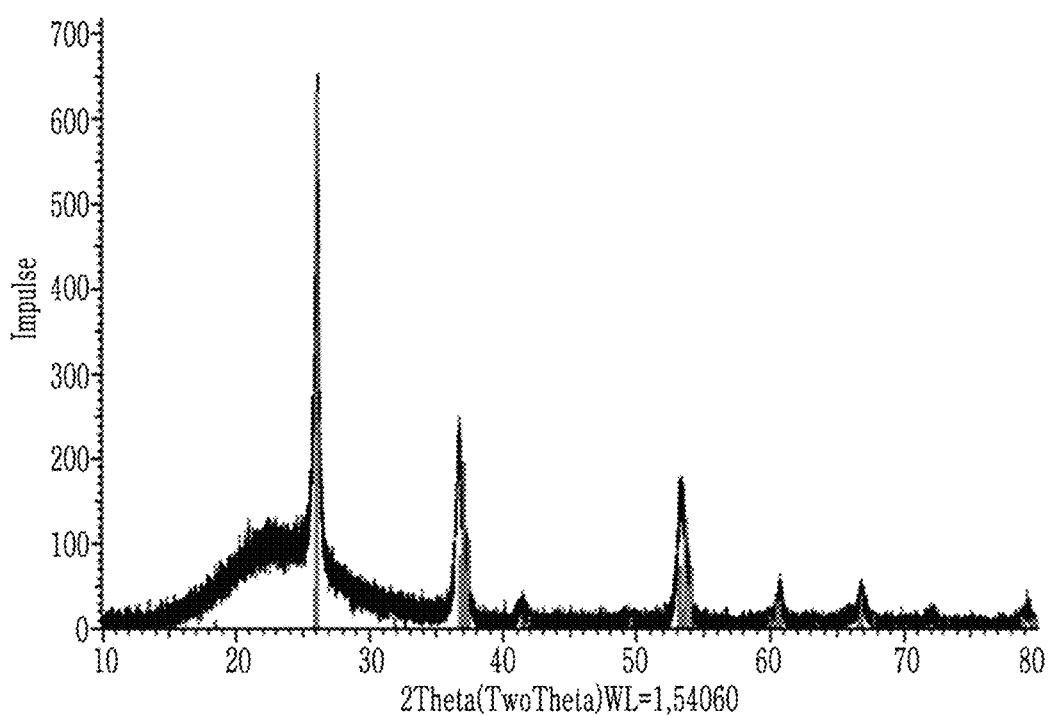

FIG. 29A and FIG. 29B are graphs showing a result according to an experimental example. According to the embodiment of the display device 1, the first blocking layer BL1 may formed of molybdenum-titanium oxide or molybdenum-tantalum oxide. FIG. 29A shows a measurement of reflectivity of the first blocking layer BL1 formed of molybdenum-titanium oxide is annealed at a temperature of 400° C. for one hour using nitrogen gas to measure the reflectivity and the result thereof is shown in FIG. 29A. FIG. 29B shows a measurement of reflectivity of the first blocking layer BL1 formed of molybdenum-tantalum oxide is annealed at a temperature of 400° C. for one hour using nitrogen gas.

Referring to FIG. 29A and FIG. 29B, the reflectivity of the first blocking layer BL1 is low even after annealing for 1 hour at a high temperature of 400° C. Although the first blocking layer BL1 is formed of molybdenum-tantalum oxide, the reflectivity is increased at some wavelengths, but the width of the wavelength at which the reflectivity increased is narrow, and the reflectivity did not increase in most wavelength ranges.

As such, the reflectivity may be kept low even in the case of forming the first blocking layer BL1 and processing (e.g., annealing) at a high temperature.

Figure 30:
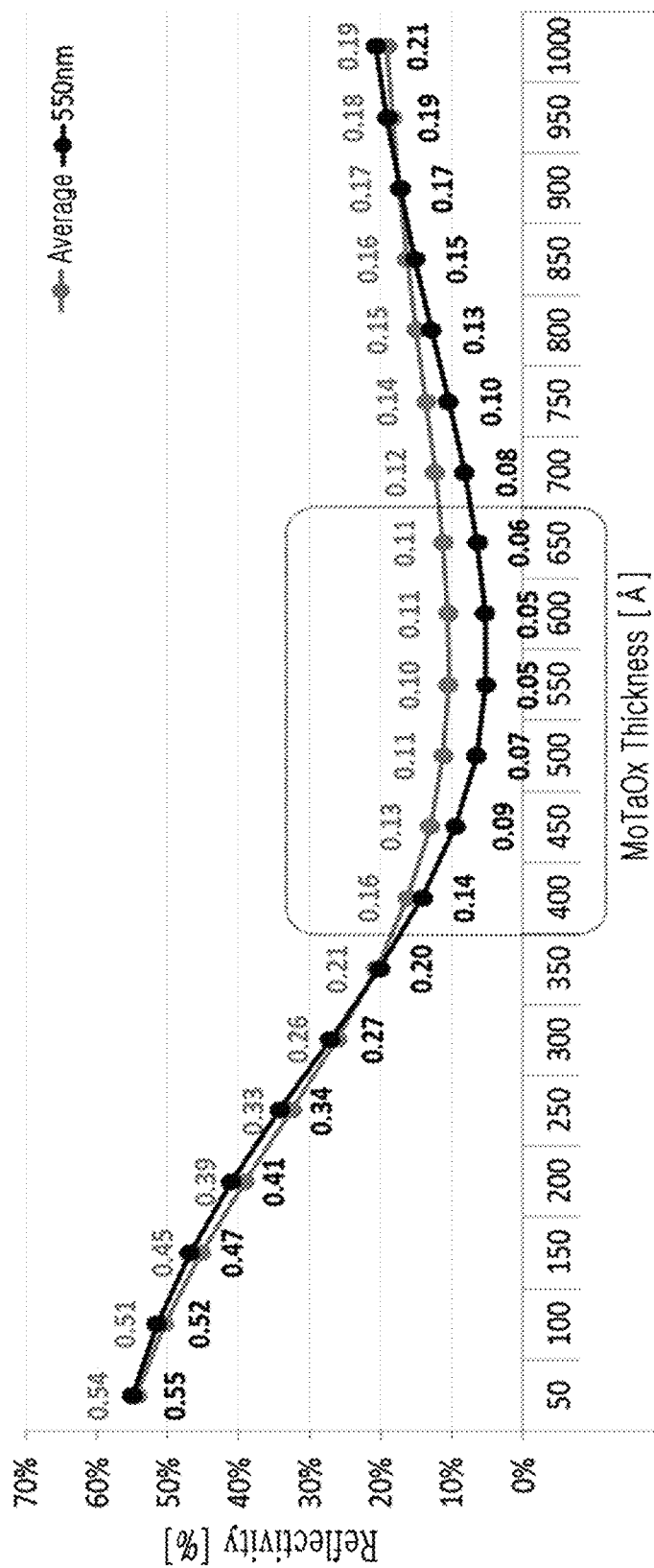
FIG. 30 is a graph showing a result according to an experimental example.

FIG. 30 is a graph showing a result according to an experimental example. In the present experimental example, the first blocking layer BL1 may be formed of molybdenum-tantalum oxide, the second blocking layer BL2 may be formed of molybdenum, and the reflectivity is measured while changing the thickness of the first blocking layer BL1. The reflectivity is measured for the average reflectivity, and the reflectivity of light is measured at a 550 nm wavelength, respectively.

Referring to FIG. 30, in a case in which the first blocking layer BL1 is formed of molybdenum-tantalum oxide and the second blocking layer BL2 is formed of molybdenum, particularly, a case that the thickness of the first blocking layer BL1 may be about 350 Å or more and about 1000 Å or less, the reflectivity is kept below a specific value.

Figure 31:
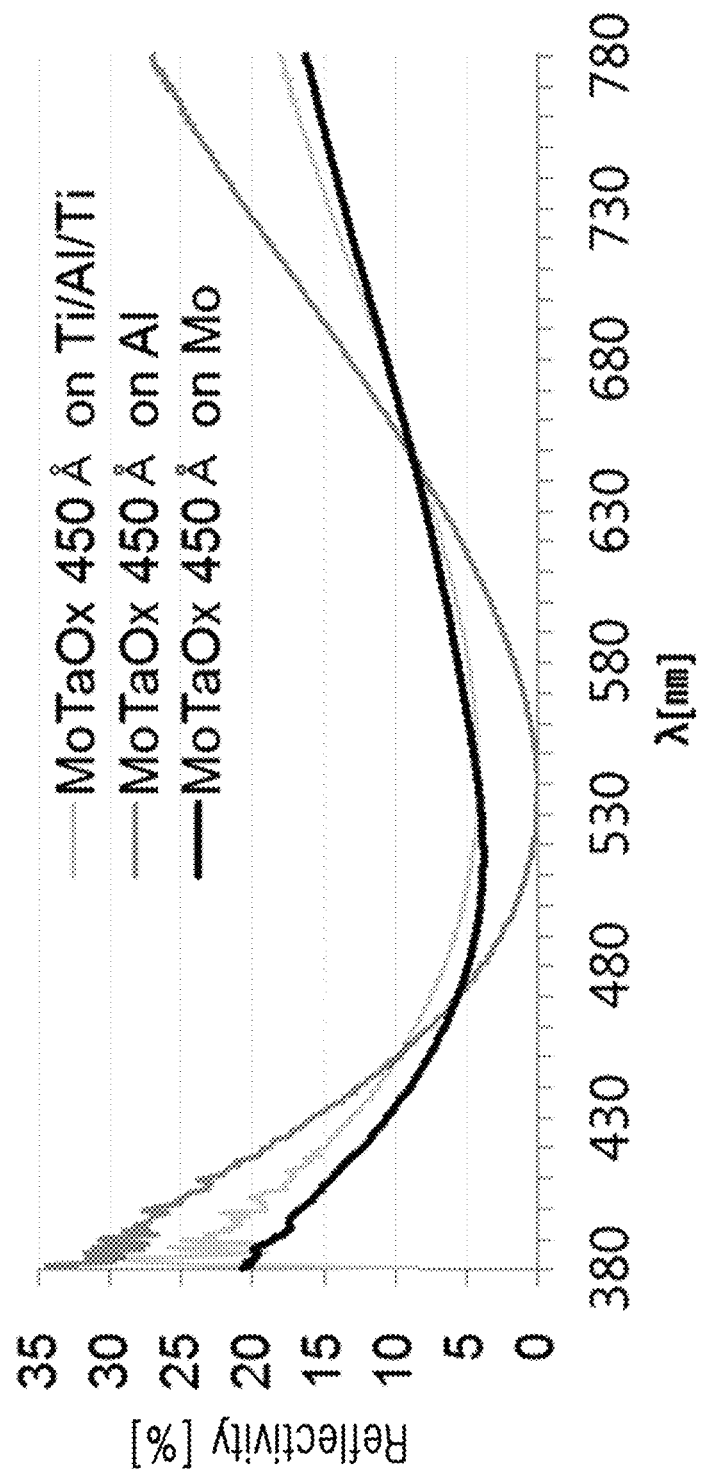
FIG. 31 is a graph showing a result according to an experimental example.

FIG. 31 is graph showing a result according to an experimental example. In the present experimental example, the first blocking layer BL1 may be formed of molybdenum-tantalum oxide, the second blocking layer BL2 may be formed of molybdenum, the thickness of the first blocking layer BL1 may be about 450 Å, the reflectivity depending on the wavelength of light is measured while changing the material of the second blocking layer BL2.

Referring to FIG. 31, in a case where the first blocking layer BL1 is formed of molybdenum-tantalum oxide and the thickness of the first blocking layer BL1 is in a range from about 350 Å to about 1000 Å, for example, 450 Å, the first blocking layer BL1 may have low reflectivity at about 400 nm to 680 nm regardless of the material of the second blocking layer BL2.

Figure 32:
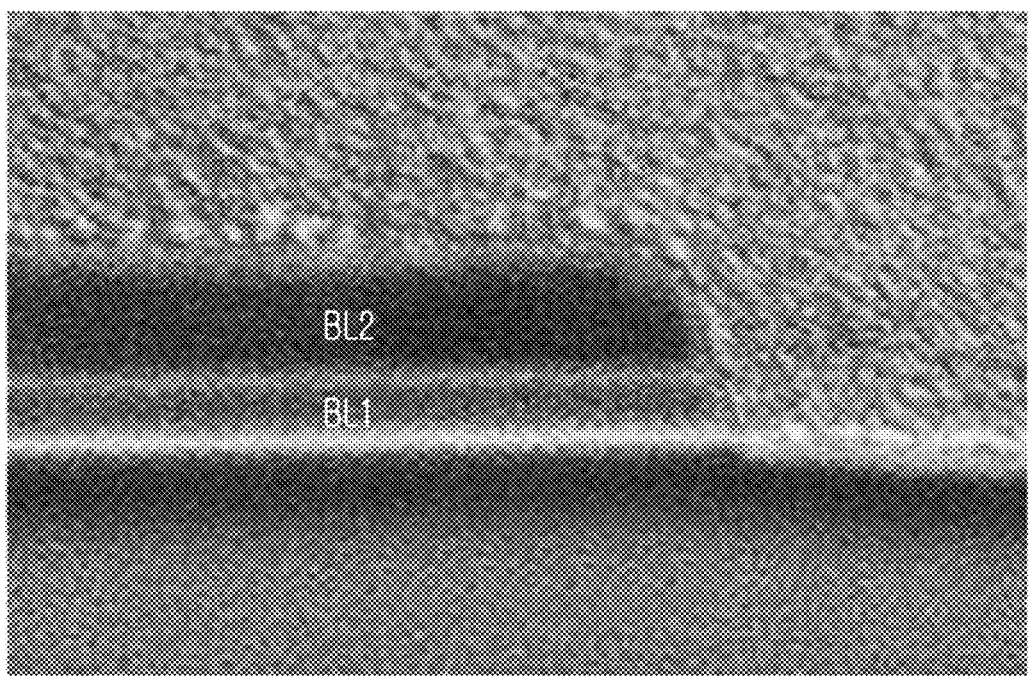
FIG. 32 is an electron micrograph showing a result according to an experimental example.

FIG. 32 is an electron micrograph showing a result according to an experimental example. In the present experimental example, in a case of forming the first blocking layer BL1 of molybdenum-tantalum oxide and the second blocking layer BL2 of molybdenum, after the blocking layer BL is etched in batch.

Referring to FIG. 32, after the blocking layer BL is etched in batch, the blocking layer BL is etched well without a protruded portion, and accordingly, it may be confirmed that fine pattern formation is obtainable.

Figure 33:
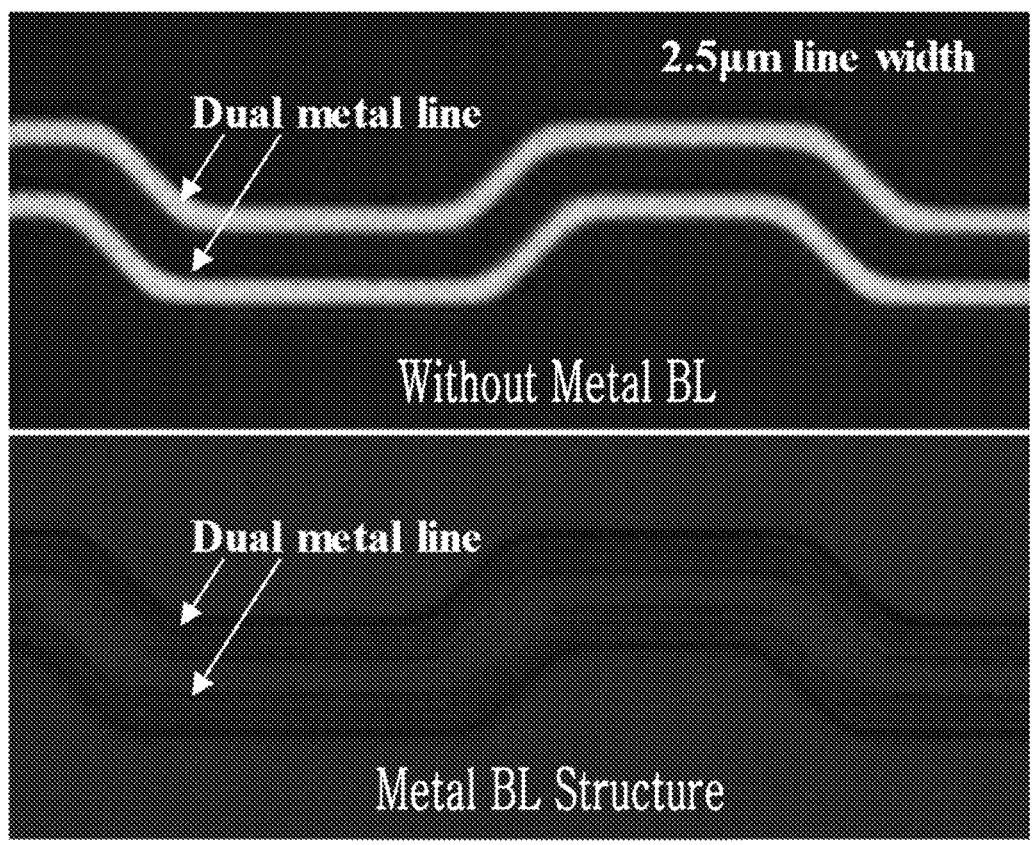
FIG. 33 is an electron micrograph showing a result according to an experimental example.

FIG. 33 is an electron micrograph showing a result according to an experimental example. In the present experimental example, the reflection of light is measured and shown after a wiring is formed to a width of about 2.5 μm, for a first case (a) in which no blocking layer BL is formed, and a second case (b) in which the blocking layer BL of a double-layer is formed.

Referring to FIG. 33, in the first case without the blocking layer BL, the reflection may occur on the wiring while in the second case of forming the blocking layer of the double-layer, the wiring may not be well recognized due to the reduced light reflection.

While the present disclosure has been described in connection with various embodiments, it is to be understood that the present disclosure is not limited to the disclosed embodiments. On the contrary, it is intended to cover various modifications and equivalent arrangements included within the spirit and scope of the present disclosure including the appended claims.

What is claimed is:

1. A display device comprising:
a substrate including a display area and a transmission area;
a blocking layer disposed at the display area of the substrate and including a first blocking layer and a second blocking layer that is disposed on the first blocking layer;
an insulating layer disposed on the blocking layer;
a transistor disposed on the insulating layer; and
a light emitting element connected to the transistor,
wherein a first reflectivity of the first blocking layer is smaller than a second reflectivity of the second blocking layer, and
wherein a first absorption coefficient of the first blocking layer is smaller than a second absorption coefficient of the second blocking layer.

2. The display device of claim 1, wherein
the first blocking layer includes a metal oxide, an organic material, or amorphous silicon, and
the second blocking layer includes a metal.

3. The display device of claim 1, wherein
the first blocking layer includes a molybdenum oxide, and
the second blocking layer includes molybdenum.

4. The display device of claim 3, wherein
the first blocking layer includes tantalum in addition to the molybdenum oxide.

5. The display device of claim 4, wherein
the first blocking layer includes 8 wt % or more of tantalum.

6. The display device of claim 3, wherein
the first blocking layer includes titanium in addition to the molybdenum oxide.

7. The display device of claim 6, wherein
the first blocking layer includes about 50 wt % of titanium.

8. The display device of claim 1, further comprising:
a first insulating layer disposed between the substrate and the first blocking layer,
wherein the first insulating layer includes silicon.

9. The display device of claim 8, wherein
the first insulating layer includes at least one of a silicon oxynitride, amorphous silicon, a silicon nitride, and a silicon oxide.

10. The display device of claim 8, further comprising:
a second insulating layer disposed between the second blocking layer and the transistor,
wherein the second insulating layer includes at least one of a silicon nitride, a silicon oxide, and a silicon oxynitride.

11. The display device of claim 10, wherein
the second insulating layer includes a first layer and a second layer that is disposed on the first layer,
the first layer includes a silicon nitride, and the second layer includes a silicon oxide.

12. A display device comprising:
a first display area including a first pixel area;
a second display area including a second pixel area and a transmission area that are disposed adjacent to each other, wherein no pixel is disposed in the transmission area;
an optical device overlapping the second display area; and
a blocking layer disposed in the second pixel area and including a first blocking layer and a second blocking layer that is disposed on the first blocking layer,
wherein a first reflectivity of the first blocking layer is smaller than a second reflectivity of the second blocking layer, and
wherein a first absorption coefficient of the first blocking layer is smaller than a second absorption coefficient of the second blocking layer.

13. The display device of claim 12, wherein
the blocking layer includes an opening that overlaps the transmission area, and
the opening has a cross-shaped planar shape.

14. The display device of claim 13, wherein
An edge of the opening has recessed portions and convex portions.

15. The display device of claim 12, wherein
the blocking layer has an opening that overlaps the transmission area, and
the opening has a circular planar shape.

16. The display device of claim 12, wherein
the first blocking layer includes a metal oxide, an organic material, or amorphous silicon, and
the second blocking layer includes a metal.

17. The display device of claim 12, wherein
the first blocking layer includes a molybdenum oxide and tantalum.

18. The display device of claim 17, wherein
the first blocking layer includes 8 wt % or more of tantalum.

19. The display device of claim 12, wherein
the first blocking layer includes a molybdenum oxide and titanium.

20. The display device of claim 19, wherein
the first blocking layer includes about 50 wt % of titanium.

21. The display device of claim 12, further comprising:
a first insulating layer disposed between the substrate and the first blocking layer,
wherein the first insulating layer includes at least of a silicon oxynitride, amorphous silicon, a silicon nitride, and a silicon oxide.

22. The display device of claim 21, further comprising:
a second insulating layer disposed between the second blocking layer and the transistor,
wherein the second insulating layer includes at least one of a silicon nitride, a silicon oxide, and a silicon oxynitride.

* * * * *